United States Patent [19]
Iguchi et al.

[11] Patent Number: 5,734,185
[45] Date of Patent: Mar. 31, 1998

[54] MOS TRANSISTOR AND FABRICATION PROCESS THEREFOR

[75] Inventors: Katsuji Iguchi, Yamatokoriyama; Kenichi Azuma, Tenri-chi; Akio Kawamura, Fukuyama, all of Japan

[73] Assignee: Sharp Kabushiki Kaisha, Osaka, Japan

[21] Appl. No.: 694,067

[22] Filed: Aug. 8, 1996

[30] Foreign Application Priority Data

Dec. 1, 1995 [JP] Japan ................................. 7-314446

[51] Int. Cl.$^6$ .......................... H01L 29/72; H01L 29/73
[52] U.S. Cl. .................... 257/336; 257/344; 257/389; 257/401; 257/406; 257/408; 257/506; 438/29; 438/42; 438/228
[58] Field of Search ..................... 257/336, 344, 257/389, 401, 406, 408, 506; 438/29, 42, 228

[56] References Cited

U.S. PATENT DOCUMENTS 5,102,816  4/1992  Manukonda et al. ................. 257/344

OTHER PUBLICATIONS

S. Kimura et al, *Applied Physics*, vol. 61, No. 11 (1992), pp. 1143–1146.

*Primary Examiner*—Edward Wojciechowicz
*Attorney, Agent, or Firm*—Nixon & Vanderhye P.C.

[57] ABSTRACT

An MOS transistor comprises a semiconductor substrate having a field region; a gate electrode formed on the semiconductor substrate through the intermediatry of a gate insulating film; and source/drain regions formed in the semiconductor substrate; wherein the field region including at least a lower insulating film and an upper insulating film made of a material permitting the upper insulating film to be selectively etched with respect to the lower insulating film; the gate electrode being configured such that the gate length of a top surface thereof is greater than the gate length of a bottom surface thereof facing a channel region positioned between the source/drain regions; the gate electrode having a sidewall spacer formed of a sidewall insulating layer made of the lower insulating film and a material permitting the sidewall insulating layer to be selectively etched with respect to the upper insulating film, the sidewall spacer contacting a side wall of the gate electrode for covering an outer periphery of the channel region; and the channel region being substantially leveled with the source/drain regions.

10 Claims, 17 Drawing Sheets

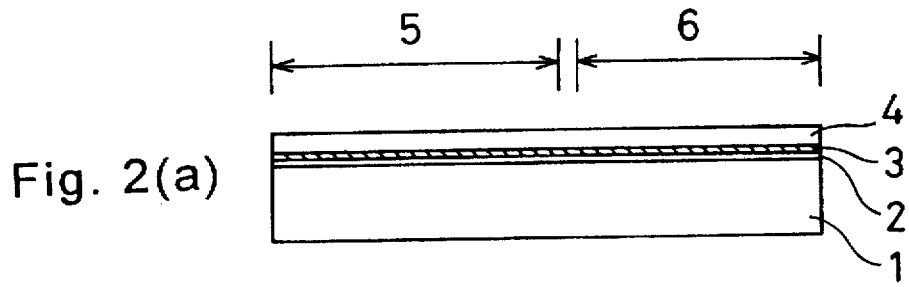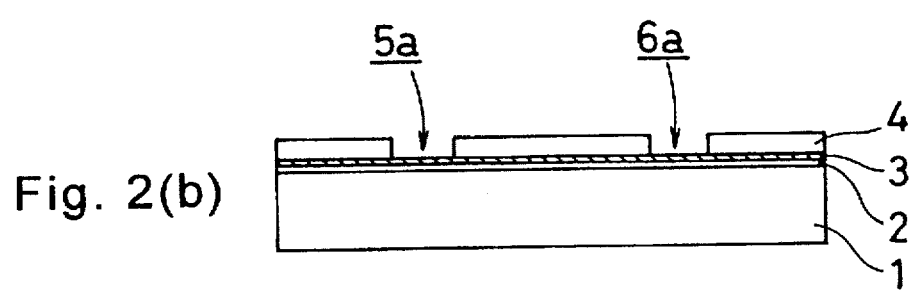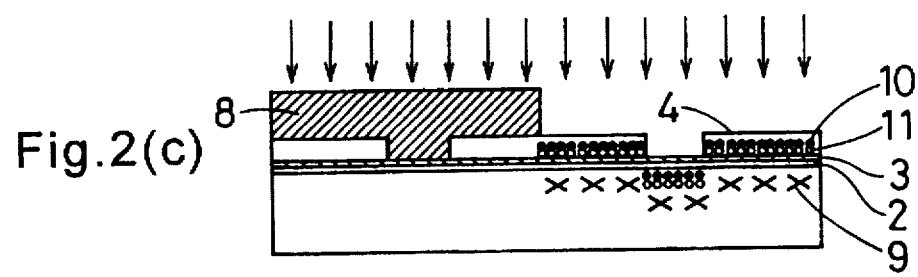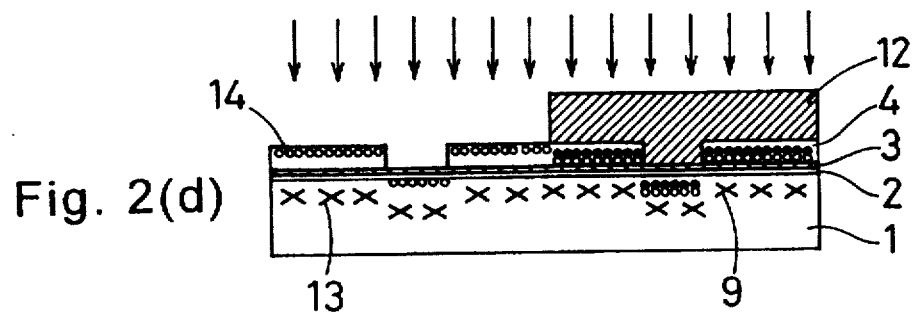

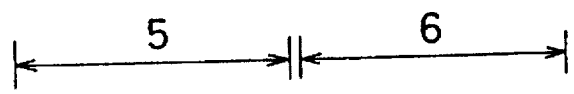
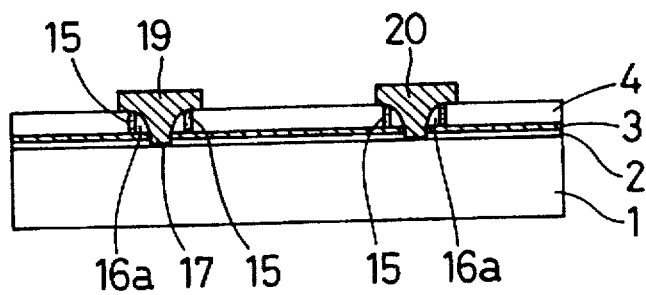
Fig. 4(i)
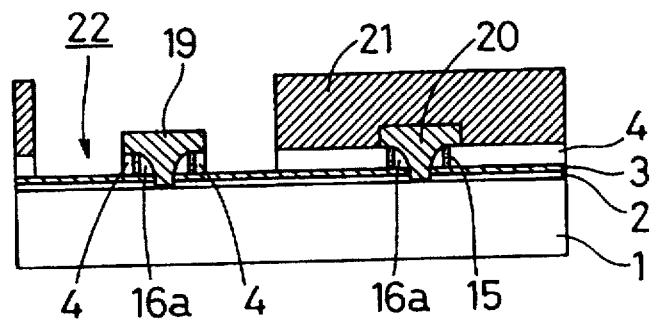
Fig. 4(j)
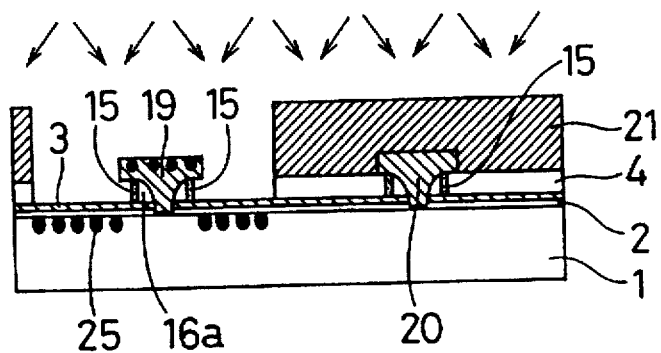
Fig. 4(k)
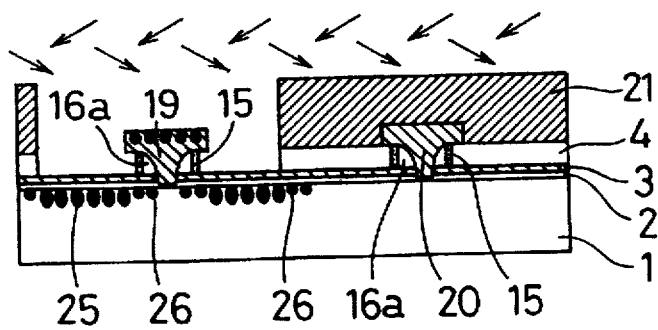
Fig. 4(l)

IMPURITY CONCENTRATION DISTRIBUTION ADJACENT TO SOURCE/ DRAIN REGION

IMPURITY CONCENTRATION DISTRIBUTION ADJACENT TO CHANNEL REGION

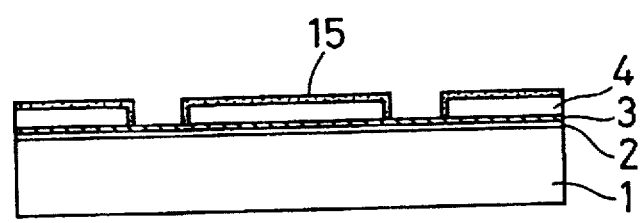
Fig. 15(e)
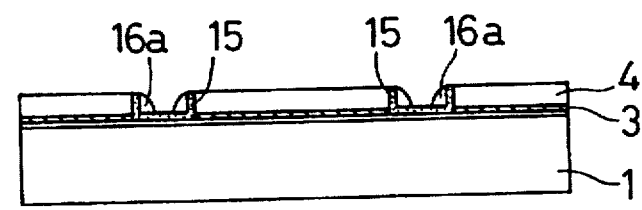
Fig. 15(f)
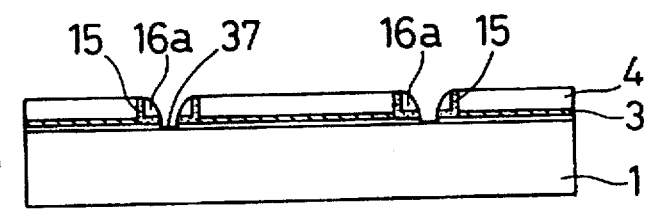
Fig. 15(g)
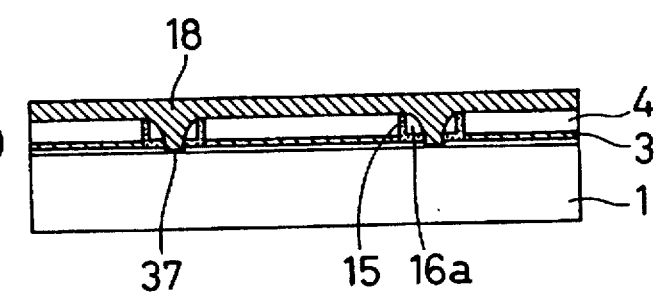
Fig. 15(h)

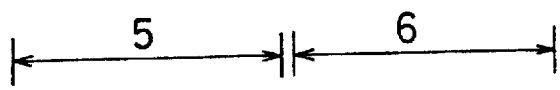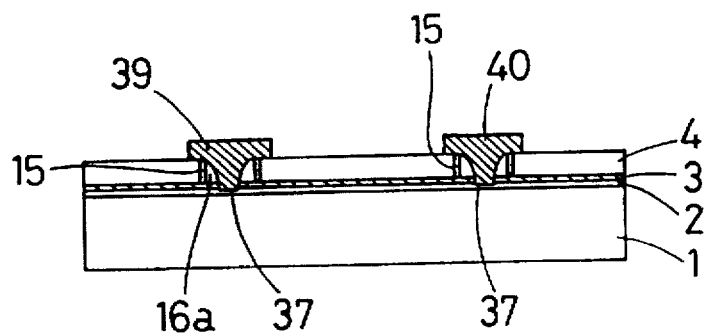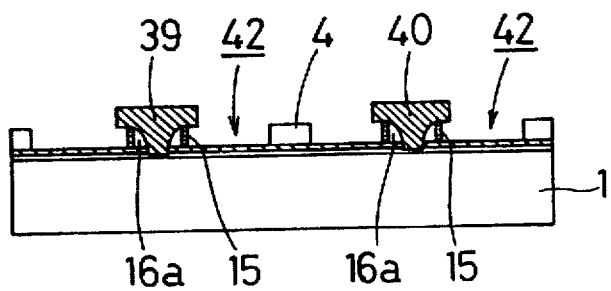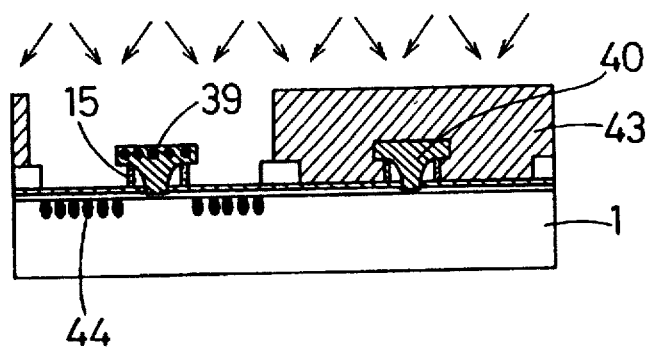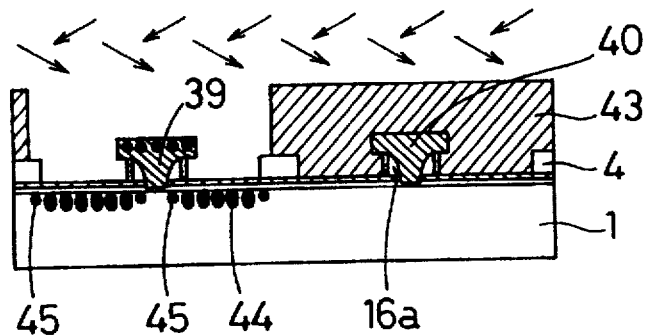

MOS TRANSISTOR AND FABRICATION PROCESS THEREFOR

BACKGROUND OF THE INVENTION

1. Field of the Invention

The present invention relates to an MOS transistor and a fabrication process therefor. More particularly, the invention relates to an MOS transistor for silicon LSI circuitry and a fabrication process therefor.

2. Description of the Prior Art

In the leading-edge silicon MOS-LSI technology, the gate length of a transistor has been reduced to 70% about every three years to improve the performance of the transistor. The integration level of transistors per chip is increased, allowing for the fabrication of higher-speed and higher-function LSI circuitry.

It has been confirmed in a development stage that MOS transistors properly operate which have a much smaller size than LSI circuitry actually being manufactured. More specifically, the operation of a transistor having a gate length of not more than 0.1 μm was already confirmed when the manufacture of the LSI circuitry using transistors each having a gate length of 0.35 μm to 0.4 μm was started.

The production of trial smaller-size transistors, particularly the patterning of gate electrodes, is not achieved by using exposure facilities for the manufacture of the conventional LSI circuitry but by using development-purpose facilities such as an electronic beam exposure apparatus with a low throughput which are not generally used for LSI circuitry mass production. Thus, it is quite difficult to start the mass production of the products by using such development-purpose facilities.

Reduction in the power consumption of chips is essential to fabricate high-performance portable devices. For this purpose, reduction in operating voltage is the most effective measures. More specifically, the reduction in the operating voltage by half achieves the reduction in the power consumption to one quarter. However, the reduction in the operating voltage results in a remarkable decrease in the operating rate of an LSI circuit. For example, it is almost impossible to allow an LSI circuit to operate at a voltage as low as 1.5 V to 1.0 V at the same operating rate as that at 3.3 V under the same design rule. For the reduction in the operating voltage, it is necessary to reduce the size of the transistors to improve the performance of the LSI circuit.

Attempts have been made to mass-produce extremely small transistors now under development without being restricted by the limitation of a micro-lithographic technique for the mass production thereof.

One of the attempts is such that a resist pattern having the possible narrowest width of the exposure limit of a practical exposure apparatus is first formed and then narrowed by isotropic oxygen plasma etching or the like for formation of a micro pattern (resist ashing process). For example, a pattern having a line width of 0.35 μm is formed by the i-line exposure technique, and then etched by 0.1 μm for formation of a gate pattern having a line width of about 0.15 μm.

To achieve high-speed operation with low voltage, reduction of parasitic capacitance, particularly the reduction of source-drain capacitance, is essential.

For the reduction of the source/drain capacitance, there has been provided a method in which impurity ions are implanted only into a part of a transistor formation region by using a resist mask to distribute the impurity in a high concentration only in channel portions and in a low concentration under source/drain regions. Another method to reduce the source/drain capacitance is to use an SOI (silicon on insulator) substrate.

To simultaneously achieve the reduction in the gate length and the reduction in the source/drain capacitance, there is provided a method of fabricating MOS transistors of a stacked diffusion layer type as shown in FIGS. 21(a) to 21(d) (Applied Physics Vol. 61, No. 11 (1992), pp. 1143-1146).

Referring to FIG. 21(a), device isolation films 62 are formed on a surface of a substrate 61, and a polysilicon film 63 and an oxide film 64 are formed on the entire surface of the resulting substrate 61.

An impurity is diffused in the polysilicon film 63, and then the polysilicon film 63 and the oxide film 64 are patterned so that portions thereof which are to serve as diffusion layers are left as shown in FIG. 21(b). This causes a surface layer of the substrate 61 which is to serve as a channel region 65 to be etched away because of its extremely low selective etching ratio with respect to polysilicon, whereas the device isolation film 62 on which the polysilicon film 63 and the oxide film 64 are etched away is not substantially etched.

Then, as illustrated in FIG. 21(c), an oxide film is formed on the entire surface of the resulting substrate 61 including the polysilicon film 63 and the oxide film 64, and then etched back to form a sidewall spacer 66 on the side walls of the polysilicon film 63 and the oxide film 64. The channel region 65 is reduced in size by the sidewall spacer 66. Impurity ions are implanted by using the polysilicon film 63, the oxide film 64 and the sidewall spacer 66 as a mask to control a transistor threshold voltage and suppress a short-channel effect. The ion implantation is performed only on a channel region opening portion 67 to allow the impurity concentration under the diffusion layer to be kept relatively low, thereby reducing the source/drain capacitance. Heat treatment is performed to diffuse the impurity into the substrate 61 from the polysilicon film 63.

As shown in FIG. 21(d), a gate insulating film 68 is formed on the opening portion 67. In turn, a polysilicon film is formed on the gate insulating film 68, and then patterned into a desired configuration to form a gate electrode 69. An interlayer insulating film 70 and an aluminum wiring 71 are formed. Thus, the transistor is completed.

The resist ashing process described above is effective to form a small number of transistors in a development stage, but presents the following disadvantages.

(a) Difficulty in ensuring a uniform etching rate in all regions within the wafer surface causes a tendency toward a variation in line width of the resist pattern.

(b) The amount of etching may be controlled only by an etching time. This presents a difficulty in ensuring reproducibility of the etching amount due to a variation in the etching rate.

(c) Nonuniform light exposure due to a slight level difference on the boundary of the device isolation region such as an LOCOS film and a difference in optical characteristics may result in a narrowed line width. Such a line width variation still remains after the line width reduction. Thus, even a line width variation within an allowable range before the line width reduction thereafter presents a significant problem. For example, a 0.03 μm variation relative to a 0.35 μm line width is less than 10% which is within the allowable range. However, after the line width is reduced by etching the resist pattern by 0.1 μm, the line width is 0.15 µm. The 0.03 µm variation relative to the 0.15 µm line width is 20% which falls outside the allowable range.

(d) Since the gate electrode has a very small line width of 0.1 µm to 0.2 µm, the interconnection resistance of the gate electrode is increased. To prevent the increase in the interconnection resistance of the gate electrode, the gate electrode may be thickened or be made of a material such as $CoSi_2$ which has a low resistance. However, the increase in the thickness of the gate electrode results in a remarkably uneven surface of the substrate, thereby causing troubles during the subsequent step of forming metal interconnection. More specifically, when the gate electrode having a line width of 0.35 µm is formed by using a 0.1 µm-thick WSi film/0.1 µm-thick polysilicon film, the line width reduction by 0.1 µm on either side is 43% to provide a 0.15 µm-wide gate electrode, but increases the resistance of the gate electrode about 2.3 times. In order to prevent the increase in the interconnection resistance, the gate electrode must be thickened about 2.3 times if the thickened portion of the gate electrode is to be formed of polysilicon. Since it is difficult to thicken only the WSi film in the gate electrode using WSi film/polysilicon film, the thickness of the gate, electrode must be almost doubled, i.e., about 0.4 µm, to reduce the interconnection resistance to a desired level. On the other hand, it is known that, when a $TiSi_2$ salicide having a low resistance is used, the decrease in the line width of the gate electrode abruptly increases the resistance, resulting in ineffective use of salicide.

The method of reducing the source/drain capacitance presents the following problems.

(e) Implantation of impurity ions into a part of the transistor formation region requires a special masking step, thereby increasing the number of fabrication process steps and a fabrication cost.

(f) The use of the SOI substrate has a great effect to reduce the source/drain capacitance, but the cost of the SOI substrate is about 3 to 10 times those of the conventional silicon substrate. In addition, the SOI substrate is often poorer in quality than the conventional silicon substrate.

Further, the method of fabricating the MOS transistor of the stacked diffusion layer type presents the following problems.

(g) The formation of a CMOS transistor requires at least 11 photolithographic steps since it involves formation of a device isolation film, an N well region, a P well region, a diffusion layer of polysilicon, an $N^+$ region of polysilicon, a $P^+$ region of polysilicon, an NMOS channel region (implantation of an impurity into a channel opening portion of an NMOS transistor), a PMOS channel region, a gate electrode, a contact hole and an aluminum interconnection. That is, the formation of the MOS transistor of the stacked diffusion layer type requires three additional photolithographic steps over the conventional CMOS formation. Specifically, two of the three additional photolithographic steps are required when the gate electrodes of the PMOS and NMOS transistors are formed by a $P^+$ polysilicon film and an $N^+$ polysilicon film, respectively (a so-called dual gate structure which is essential to suppress the PMOS short-channel effect and is considered to be indispensable where the gate length is not greater than 0.25 µm). The remainder of the three additional photolithographic steps is required for the patterning of the diffusion layer of polysilicon.

(h) During the step-of etching the polysilicon film and the oxide film formed on the silicon substrate for patterning of the diffusion layer, a surface portion of the silicon substrate which is to serve as the channel region is etched and exposed to an oxide film etching atmosphere when the sidewall spacer is formed. This damages the gate insulating film, and reduces transistor current due to decrease in the mobility of electrons or holes.

(i) The photolithographic step for patterning the diffusion layer as well as determining the gate length is performed after the device isolation region is formed. The slight level difference and the difference in optical characteristics produce a locally narrowed line width in the resist pattern during light exposure, resulting in a variation in the line width of the resist pattern.

(j) The polysilicon film which is to serve as the diffusion layer is coated with an insulating film because of the necessity to insulate the gate electrode and the diffusion layer from each other. In this case, however, it is impossible to employ the salicide technique for forming $TiSi_2$ simultaneously on the gate electrode and on the diffusion layer (the salicide technique is considered to be essential when the gate length is not more than 0.25 µm).

(k) The gate electrode and the diffusion layer are provided with a relatively thin oxide film (up to 0.1 µm) interposed therebetween, resulting in a greater parasitic capacitance between the gate electrode and the diffusion layer than that of the prior art.

(l) The polysilicon film (e.g., 0.1 µm) for the diffusion layer and the oxide film (e.g., 0.1 µm) are formed on the device isolation region, and the polysilicon film (e.g., 0.2 µm) for the gate electrode is formed thereon. The level difference on the substrate is about 0.4 µm which is almost twice greater than that of the conventional CMOS transistor (which is 0.2 µm).

SUMMARY OF THE INVENTION

The present invention provides an MOS transistor comprising: a semiconductor substrate having a field region; a gate electrode formed on the semiconductor substrate through the intermediatry of a gate insulating film; and source/drain regions formed in the semiconductor substrate;

wherein the field region including at least a lower insulating film and an upper insulating film made of a material permitting the upper insulating film to be selectively etched with respect to the lower insulating film; the gate electrode being configured such that the gate length of a top surface thereof is greater than the gate length of a bottom surface thereof facing a channel region positioned between the source/drain regions; the gate electrode having a sidewall spacer formed of a sidewall insulating layer made of the lower insulating film and a material permitting the sidewall insulating layer to be selectively etched with respect to the upper insulating film, the sidewall spacer contacting a side wall of the gate electrode for covering an outer periphery of the channel region; and the channel region being substantially leveled with the source/drain regions.

Further, the present invention provides a process for fabricating an MOS transistor, comprising the steps of: (i) forming a lower insulating film and an upper insulating film on the entire surface of a semiconductor substrate, and forming an opening extending to the lower insulating film in the upper insulating film on a channel region and a periphery portion of the channel region; (ii) forming a sidewall insulating layer of a material permitting the sidewall insulating layer to be selectively etched with respect to the upper insulating films on a side wall of the opening formed in the upper insulating film, and removing a portion of the lower insulating film which is present in the bottom of the opening and does not underlie the sidewall insulating layer to expose the semiconductor substrate; (iii) forming a gate insulating film on the exposed semiconductor substrate; (iv) forming a gate electrode on the gate insulating film so that at least a portion of the sidewall insulating layer is covered therewith; and (v) removing a portion of the upper insulating film which overlies regions where source/drain regions are to be formed, to form a sidewall spacer contacting a side wall of the gate electrode.

BRIEF DESCRIPTION OF THE DRAWINGS

FIGS. 2(a) to 2(d), FIGS. 3(e) to 3(h), FIGS. 4(i) to 4(l), FIGS. 5(m) to 5(o) and FIGS. 6(p) and 6(q) are schematic sectional views illustrating a first fabrication process for the MOS transistor of FIGS. 1(a) and 1(b);

FIGS. 14(a) to 14(d), FIGS. 15(e) to 15(h), FIGS. 16(i) to 16(l), and FIGS. 17(m) to 17(o) are schematic sectional views illustrating a second fabrication process for the MOS transistor according to the present invention;

DESCRIPTION OF THE PREFERRED EMBODIMENTS

Figure 1A:
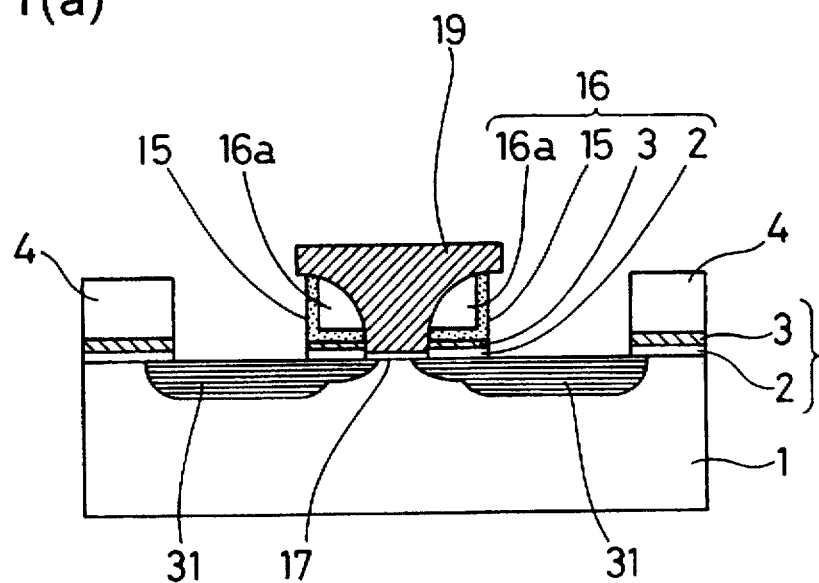
FIGS. 1(a) and 1(b) are a schematic cross-sectional view and a schematic longitudinal sectional view, respectively, illustrating an MOS transistor according to one embodiment of the present invention.

An MOS transistor according to the present invention is formed on a semiconductor substrate. Preferably used as the semiconductor substrate is a silicon substrate, for example. A field region is formed on the semiconductor substrate to define a region where the MOS transistor is to be formed. One or more P-type wells, N-type wells, P-type regions or N-type regions may be formed as required in the semiconductor substrate.

The field region comprises at least a lower insulating film and an upper insulating film.

The lower insulating film comprises, for example, a single-layer film such as a silicon oxide film or a silicon nitride film, a double-layer film such as silicon nitride film/silicon oxide film or silicon oxide film/silicon nitride film, or a triple-layer film such as an silicon oxide film/silicon nitride film/silicon oxide film (ONO film). Among those, the double-layer film consisting of a silicon nitride film/silicon oxide film is preferably used. In this case, the respective films constituting the double-layer film may have thicknesses such that the lower insulating film can effectively and sufficiently function as an insulating film and as an etching stopper. For example, the silicon nitride film and silicon oxide film of the double-layer film preferably have thicknesses of about 5 nm to about 50 nm and about 5 nm to about 30 nm, respectively.

The upper insulating film may be formed of a material which is selected from those capable of being used as the lower insulating film and which permits the upper insulating film to be selectively etched with respect to the lower insulating film. It is herein defined that the materials which permit the upper insulating film to be selectively etched with respect to the lower insulating film are such that the etching rate of the lower insulating film to the upper insulating film can be controlled to be about 1:5 to about 1:30 when the upper and lower insulating films are simultaneously etched by a known etching method such as reactive ion etching. In other words, it may be defined that the material for the upper insulating film can be etched 5 to 30 times faster than the material for the lower insulating film when the materials for the upper and lower insulating films are subjected to etch under the same conditions. A desired etching rate of the upper and lower insulating films can be obtained by the selection of proper materials, the later described film formation methods or the like. Where the lower insulating film is a double-layer film consisting of a silicon nitride film/silicon oxide film, for example, the upper insulating film is preferably a silicon oxide film capable of being selectively etched with respect to the silicon nitride film in the surface portion of the lower insulating film. In this case, the upper insulating film may have such a thickness as to effectively function as the field region cooperatively with the lower insulating film, for example, about 100 nm to about 300 nm preferably.

A gate electrode is formed on a gate insulating film formed on a portion of the semiconductor substrate where the field region is not formed. The gate insulating film preferably employs a silicon oxide film having a thickness of about 15 Å to about 60 Å. The gate electrode comprises, for example, a single-layer film or a film consisting of two or more layers made of polysilicon, a silicide of a high-melting-point metal, a polycide of a silicide and polysilicon, or the like. Where polysilicon is employed, for example, the film thickness is preferably about 50 nm to about 300 nm. Where a polycide is employed, a silicide film of a high-melting-point metal such as Ti, Ta or W having a thickness of about 50 nm to about 200 nm is formed on a polysilicon film having a thickness of about 50 nm to about 200 nm.

The configuration of the gate electrode is such that the top surface is greater in gate length than the bottom surface facing a channel region. More specifically, at least a lower portion of the side wall of the gate electrode is shaped to have an indentation or recess inwardly indented in a linear, curved or stepped form. The recess is preferably symmetric, but may be asymmetric. The inward indentation may be formed throughout the side wall of the gate electrode, but an upper portion of the side wall is preferably perpendicular to the substrate surface. The gate length of the bottom surface facing the channel region is preferably smaller by 100 nm to 300 nm than the gate length of the top surface. More specifically, the gate length of the bottom surface facing the channel region is about 0.05 µm to about 0.3 µm, and the gate length of the top surface is about 0.35 µm to about 0.4 µm. The gate electrode, however, may have a shorter gate length.

Figure 9:
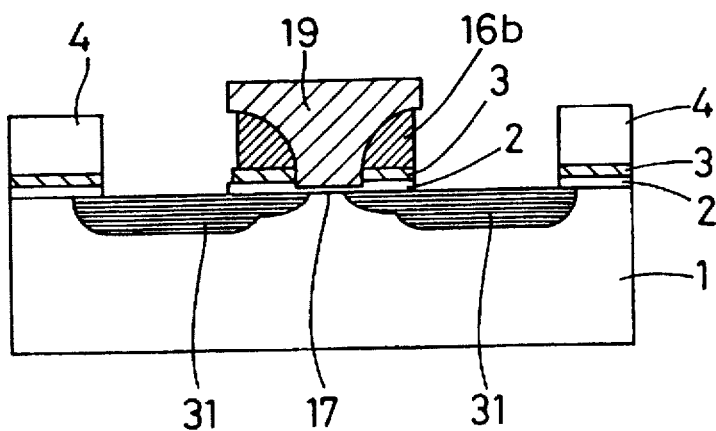
FIG. 9 is a schematic sectional view illustrating the MOS transistor according to another embodiment of the present invention.

On the side walls of the gate electrode is formed a sidewall spacer in contact with the gate electrode to cover the outer periphery of the channel region of the MOS transistor. The sidewall spacer is preferably formed in the recess of the gate electrode. The sidewall spacer comprises the lower insulating film constituting the field region and a sidewall insulating layer formed on the lower insulating film. The sidewall insulating layer may comprise a single-layer film, a double-layer film or a triple-layer film formed of substantially the same materials as those for the lower insulating film which permit the side wall insulating layer to be selectively etched with respect to the upper insulating film. Where the upper insulating film is a silicon oxide film, for example, the sidewall insulating layer may be a single-layer silicon nitride film (indicated by a reference character 16b in FIG. 9). In consideration of the selective etching ratio to the lower insulating film, the sidewall insulating layer preferably comprises a silicon oxide film disposed in the recess of the gate electrode and a silicon nitride film formed to cover the silicon oxide film. In this case, the sidewall insulating layer is preferably shaped to have a surface substantially perpendicular to the semiconductor substrate surface. The thickness of the sidewall spacer may be suitably adjusted depending on the line width of the gate electrode, but is preferably about 50 nm to about 150 nm at the maximum just above the semiconductor substrate.

Source/drain regions are formed in a portion of the semiconductor substrate where the field region is not formed. The channel region is located under the gate electrode between the source/drain regions. The surface of the portion of the semiconductor substrate in which the source/drain regions and the channel region are located is substantially flat. The source/drain regions preferably contain impurity ions such as phosphorus, arsenic or boron ions in a concentration on the order of $1 \times 10^{19}$ cm$^{-3}$ to $1 \times 10^{21}$ cm$^{-3}$, and may be of an LDD structure.

In a process for fabricating an MOS transistor according to the present invention, a lower insulating film and an upper insulating film are formed on the entire surface of a semiconductor substrate in the step (i). For example, a silicon oxide film and a silicon nitride film are sequentially formed as the lower insulating film, and a silicon oxide film is formed as the upper insulating film. The formation of the silicon oxide film may be achieved by thermal oxidation, atmospheric pressure CVD or low pressure CVD, and the formation of the silicon nitride film may be achieved by atmospheric pressure CVD or low pressure CVD. Then, an opening is formed in the upper insulating film on a channel region and a peripheral portion of the channel region so as to extend to the lower insulating film. The formation of the opening is achieved by forming a resist pattern having an opening portion corresponding to the opening by way of a known technique such as a photolithographic and etching process and then etching the upper insulating film by way of reactive ion etching with use of the resist pattern as a mask under conditions that allow only the upper insulating film to be selectively etched. More specifically, where the lower and upper insulating films are the silicon nitride film and silicon oxide film, respectively, the etching may be performed at a pressure of about 5 mTorr in an oxide film etching apparatus (e.g., HDP-5300 available from AMAT) by inductively coupled plasma using an $CH_2F_2/C_3F_8/Ar$ gas. In this manner, the provision of the lower insulating film made of a material having a smaller etching rate than the upper insulating film allows only the upper insulating film to be selectively etched to form the opening extending to the lower insulating film. The formation of the opening determines the gate length together with the subsequent step of forming a sidewall spacer.

In the step (ii) of the fabrication process, a sidewall insulating layer is formed on the side wall of the opening in the upper insulating film. First, an insulating layer for formation of the sidewall insulating layer is formed on the upper insulating film including the opening. The insulating layer is preferably made of a material which permits the insulating layer to be selectively etched with respect to the upper insulating layer formed in the step (i). For example, where the upper insulating film is a silicon oxide film, the insulating layer is preferably formed by first forming a thin silicon nitride film serving as an etching stopper for the silicon oxide film of the upper insulating film on the entire surface of the upper insulating film and then forming a silicon oxide film on the thin silicon nitride film. Employment of a selective etching process allows a single-layer silicon nitride film to be used as the insulating layer. Then, the insulating layer is anisotropically etched back to permit a portion of the insulating layer to remain only on the side wall of the opening for the formation of the sidewall insulating layer. In this case, since the insulating layer is made of a material which permits the insulating layer to be selectively etched with respect to the upper insulating film, damages to the semiconductor substrate due to overetching can be prevented. The sidewall insulating layer herein formed serves as part of the side-wall spacer at the final state, and the thickness of the insulating layer for the sidewall insulating layer controls the final gate length L. Subsequently, a portion of the lower insulating film in the bottom of the opening which does not underlie the sidewall insulating layer is removed to expose the semiconductor substrate. The lower insulating film may be removed by a dry etching process such as reactive ion etching, a wet etching process or the like. Where the silicon nitride film/ silicon oxide film is used as the lower insulating film, for example, the silicon nitride film is selectively etched away at a pressure of about 100 mTorr in an SiN etching apparatus (e.g., P-5000 available from AMAT) by magnetron plasma using a $CH_3F/O_2/Ar$ gas, and the silicon oxide film is then removed by a wet etching process using an aqueous solution of hydrofluoric acid or the like. Such a process prevents damages to the semiconductor substrate resulting from overetching thereof.

In the step (iii) of the fabrication process, a gate insulating film is formed on the exposed portion of the semiconductor substrate. The formation of the gate insulating film is preferably achieved by thermal oxidation at a temperature of about 700° C. to about 1000° C. or by hydrochloric acid oxidation to allow the gate insulating film to have a much reduced thickness. Prior to the formation of the gate insulating film, the steps of washing and rinsing the semiconductor substrate surface by a RCA cleaning method may be performed as required. To suppress impurity diffusion from a gate electrode to the semiconductor substrate, the gate insulating film may contain one- to several-percent nitrogen at the interface of the gate insulating film and the semiconductor substrate. In such a case, annealing may be performed in an atmosphere containing several- to 90-percent $N_2O$ at a temperature of about 800° C. to about 1,000° C. for about five minutes to about one hour, for example, after the formation of the gate insulating film.

In the step (iv) of the fabrication process, a gate electrode is formed on the gate insulating film. First, a gate electrode material such as polysilicon is deposited on the entire surface of the resulting semiconductor substrate including the gate insulating film, and then patterned by a known technique such as photolithographic and etching process to form the gate electrode having a desired configuration. Deposition of polysilicon is achieved by the atmospheric pressure CVD or low pressure CVD, for example, and the deposited polysilicon is preferably doped with P-type or N-type impurity ions as required. In consideration of an alignment margin AM and a sidewall spacer width SW, the gate electrode material is patterned so that a gate electrode width Ls (the gate length of the top surface of the gate electrode, see FIG. 10) is greater than the gate length Lb (the gate length of the bottom surface of the gate electrode facing the channel region) by at least 2(AM-SW), preferably 2 AM. In other words, the gate electrode material is preferably patterned to cover at least a portion of the sidewall insulating layer. The patterning does not require the conditions which provide a great selective etching ratio to the upper insulating film, since the relatively thick upper insulating film is formed under the gate electrode material. In addition, the patterning in this step does not directly determine the gate length and, therefore, does not require a high accuracy. For example, the conventional method requires a line width control accuracy of not more than about 10% of the minimum line width on a polysilicon film having a very high reflection factor. However, the patterning in this step only requires a line width control accuracy of not more than about 30% of the minimum line width. Connection portions for external interconnection lines and connection portions for the gate electrodes of other transistors may be formed simultaneously with the patterning of the gate electrode.

In the step (v) of the fabrication process, portions of the upper insulating film provided on regions where source/drain regions are to be formed are removed. For example, only the upper insulating film is selectively etched away in the same manner as the etching for the opening formation in the step (i). This allows the semiconductor substrate surface to be protected from overetching. In some cases, the upper insulating film under the gate electrode cannot sufficiently be removed by the etching in this step. If this occurs, a wet etching process using, for example, an aqueous solution of HF may be subsequently performed to completely remove the portions of the upper insulating film which overlie the regions where the source/drain regions are to be formed. These etching processes cause the gate electrode to have an overhanging configuration, if no misalignment occurs during the patterning of the gate electrode. The sidewall spacer including the lower insulating film and the sidewall insulating layer is to be located in the recess of the overhanging gate electrode.

Figure 10:
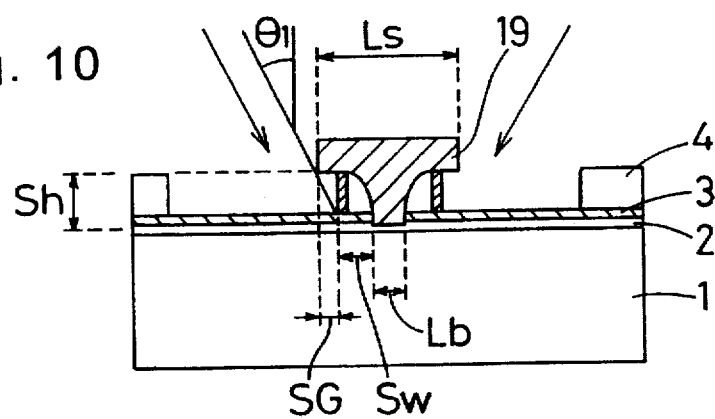
FIGS. 10 and 11 are sectional views for explaining the angle of ion implantation in the fabrication process for the MOS transistor of FIGS. 1(a) and 1(b)
Figure 11:
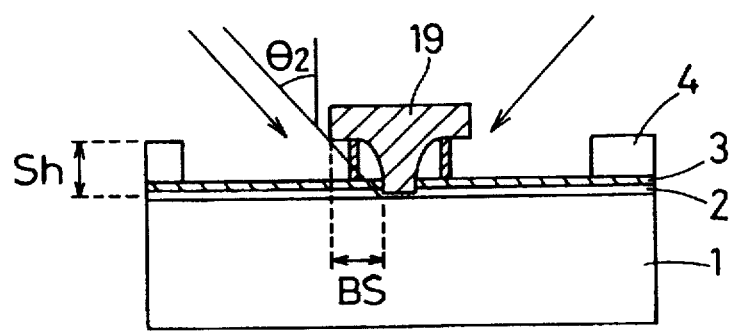

In the process for fabricating the MOS transistor according to the present invention, ion implantation is preferably performed to form the source/drain regions after completion of the steps (i) to (v). The dose, implantation energy, angle, and the number of times of the ion implantation are not particularly limited as far as diffusion layers which define the source/drain regions having desired impurity concentration, depth and configuration are formed. However, as described above, if the final configuration of the gate electrode is an overhanging configuration, ions are preferably implanted at a predetermined angle, and the ion implantation is preferably performed a plurality of times at different angles. For example, to form an NMOS transistor, a first ion implantation process is performed in such a manner that arsenic ions or the like are implanted at an angle of $\theta_1$ or more at an implantation energy of about 30 keV to about 150 keV in a dose on the order of $1 \times 10^{15}$ cm$^{-2}$ to $1 \times 10^{16}$ cm$^{-2}$ by using the gate electrode and the sidewall spacer as a mask, as shown in FIG. 10. Then, a second ion implantation process is preferably performed in such a manner that arsenic ions, phosphorus ions or the like are implanted at an angle of $\theta_2$ or more at an implantation energy of about 50 keV to about 200 keV in a dose on the order of $1 \times 10^{13}$ cm$^{-2}$ to $1 \times 10^{15}$ cm$^{-2}$ as shown in FIG. 11. On the other hand, to form a PMOS transistor, a first ion implantation process is performed in such a manner that boron ions or the like are implanted at an angle of $\theta_1$ or more at an implantation energy of about 5 keV to about 40 keV in a dose on the order of $1 \times 10^{15}$ cm$^{-2}$ to $1 \times 10^{16}$ cm$^{-2}$ by using the gate electrode and the sidewall spacer as a mask, as shown in FIG. 10. Then, a second ion implantation process is preferably performed in such a manner that boron ions or the like are implanted at an angle of $\theta_2$ or more at an implantation energy of about 10 keV to about 50 keV in a dose on the order of $1 \times 10^{13}$ cm$^{-2}$ to $1 \times 10^{15}$ cm$^{-2}$ as shown in FIG. 11.

The angle $\theta_1$ is defined as follows:
$\tan \theta_1 = SG/Sh$, where SG means distance between sidewall spacer end and gate electrode end, Sh means height of sidewall spacer.

The angle $\theta_2$ is defined as follows:
$\tan \theta_2 = BS/Sh$, where BS means distance between gate electrode end on its bottom surface facing channel region and gate electrode end on its top surface.

The oblique ion implantation in a dose of greater than $1 \times 10^{15}$ cm$^{-2}$ might require much time, resulting in a reduced productivity. In such a case, it is preferred to suitably adjust the dose of the impurity and the implantation angle for the ion implantation. After the ion implantation, heat treatment may be preferably performed, for example, at a temperature of about 800° C. to about 1000° C. for about 1 minute to about 60 minutes. Alternatively, a rapid heat treatment may be performed at a temperature of about 900° C. to about 1200° C. for about 1 second to about 60 seconds.

Subsequently, known process steps such as formation of an interlayer insulating film, contact holes and an interconnection layer are performed to complete the MOS transistor. The interlayer insulating film may be formed of SiN, $SiO_2$, BSG, BPSG, SOG or the like by atmospheric pressure CVD, low pressure CVD, plasma CVD or the like, for example. After the interlayer insulating film is formed, a rapid heat treatment may be performed at a temperature of about 300° C. to about 900° C. for about 1 minute to about 60 minutes or a rapid heat treatment at about 1000° C. for about 30 seconds.

In the process for fabricating the MOS transistor according to the present invention, ion implantation for threshold voltage control, channel stopping or punch-through stopping, counter-doping and the like may optionally be performed between the steps (i) to (v). More specifically, the ion implantation may be preferably performed after the step (i).

For a PMOS transistor, a resist is deposited to cover an NMOS transistor formation region, and N-type impurity ions are implanted through the upper insulating film so that the peak of implanted ion distribution is located adjacent the semiconductor substrate surface, in order to form a channel stopper for isolation of different PMOS transistors from each other. For example, the ion implantation process employs phosphorus ions, an implantation energy of about 80 keV to about 300 keV and a dose of about $1\times10^{12}$ cm$^{-2}$ to about $5\times10^{13}$ cm$^{-2}$ (an impurity concentration on the order of $1\times10^{16}$ cm$^{-3}$ to $1\times10^{18}$ cm$^{-3}$). This ion implantation process permits the impurity ions to be implanted into the inside of the semiconductor substrate (designated by a reference character B in FIG. 13) adjacent to the channel region of the PMOS transistor because the upper insulating film is removed, and permits the impurity ions to be implanted into a surface portion of the semiconductor substrate adjacent to the source/drain regions (designated by a reference character A in FIG. 12). At this time, to reduce the well resistance for prevention of latch-up, phosphorus ions, for example, may be deeply implanted into the well at an implantation energy of about 250 keV to about 600 keV in a dose of about $1\times10^{12}$ cm$^{-2}$ to about $5\times10^{15}$ cm$^{-2}$ (an impurity concentration of about $1\times10^{17}$ cm$^{-3}$ to about $5\times10^{18}$ cm$^{-3}$) (designated by a reference character C in FIG. 12 and by a reference character D in FIG. 13). Further, to control the threshold voltage of the PMOS transistor, N-type impurity ions are implanted through the upper insulating film so that the peak of implanted ion distribution is located near the semiconductor substrate surface adjacent to the channel region. For example, the ion implantation process employs arsenic ions, an implantation energy of about 20 keV to about 200 keV and a dose of about $1\times10^{12}$ cm$^{-2}$ to about $3\times10^{13}$ cm$^{-2}$ (an impurity concentration of about $3\times10^{17}$ cm$^{-3}$ to about $3\times10^{18}$ cm$^{-3}$). This ion implantation process allows the impurity ions to be implanted into the surface layer of the channel region of the PMOS transistor (designated by a reference character E in FIG. 13), but substantially prevents the impurity ions from entering the inside of the semiconductor substrate in regions other than the channel region because the upper insulating film is formed. The ion implantation process need not employ a single implantation energy and a single ion type, but may employ different N-type impurities such as phosphorus ions, arsenic ions and the like which are to be implanted to different depths at a plurality of implantation stages. To form a PMOS transistor of a buried channel type, P-type impurity ions may be implanted through the upper insulating film for counter-doping so that the peak of implanted ion distribution is located in a further upper surface portion of the channel region. For example, the ion implantation process employs boron ions, an implantation energy of about 5 keV to about 20 keV and a dose of about $2\times10^{12}$ cm$^{-2}$ to about $8\times10^{12}$ cm$^{-2}$ (an impurity concentration of about $3\times10^{17}$ cm$^{-3}$ to about $3\times10^{18}$ cm$^{-3}$). This ion implantation process permits the impurity ions to be implanted into the further upper surface layer in the channel region of the PMOS transistor, but substantially prevents the impurity ions from entering the inside of the semiconductor substrate in the regions other than the channel region. The ion implantation process need not employ a single implantation energy and a single ion type, but may employ different P-type impurities such as BF$_2$ ions and the like which are to be implanted to different depths at a plurality of implantation stages.

For an NMOS transistor, a resist is deposited to cover a PMOS transistor formation region, and P-type impurity ions are implanted through the upper insulating film so that the peak of implanted ion distribution is located adjacent the semiconductor substrate surface, in order to form a channel stopper for isolation of different NMOS transistors from each other. For example, the ion implantation process employs boron ions, an implantation energy of about 30 keV to about 130 keV and a dose of about $1\times10^{12}$ cm$^{-2}$ to about $3\times10^{13}$ cm$^{-2}$. This ion implantation process permits the impurity ions to be implanted into the inside of the semiconductor substrate adjacent to the channel region of the NMOS transistor because the upper insulating film is removed, and permits the impurity ions to be implanted into the surface portion of the semiconductor substrate adjacent to the source/drain regions. At this time, to reduce the well resistance for prevention of latch-up, boron ions may be deeply implanted into the well at an implantation energy of about 100 keV to about 300 keV in a dose of about $1\times10^{12}$ cm$^{-2}$ to about $5\times10^{13}$ cm$^{-2}$. Further, to control the threshold voltage of the NMOS transistor, P-type impurity ions are implanted through the upper insulating film so that the peak of implanted ion distribution is located near the semiconductor substrate surface adjacent to the channel region. For example, the ion implantation process employs boron ions, an implantation energy of about 5 keV to about 20 keV and a dose of about $1\times10^{12}$ cm$^{-2}$ to about $5\times10^{13}$ cm$^{-2}$. This ion implantation process allows the impurity ions to be implanted into the surface layer of the channel region of the NMOS transistor, but substantially prevents the impurity ions from entering the inside of the semiconductor substrate in regions other than the channel region because the upper insulating film is formed. The ion implantation process need not employ a single implantation energy and a single ion type, but may employ different P-type impurities such as BF$_2$ which are to be implanted to different depths at a plurality of implantation stages.

Figure 12:
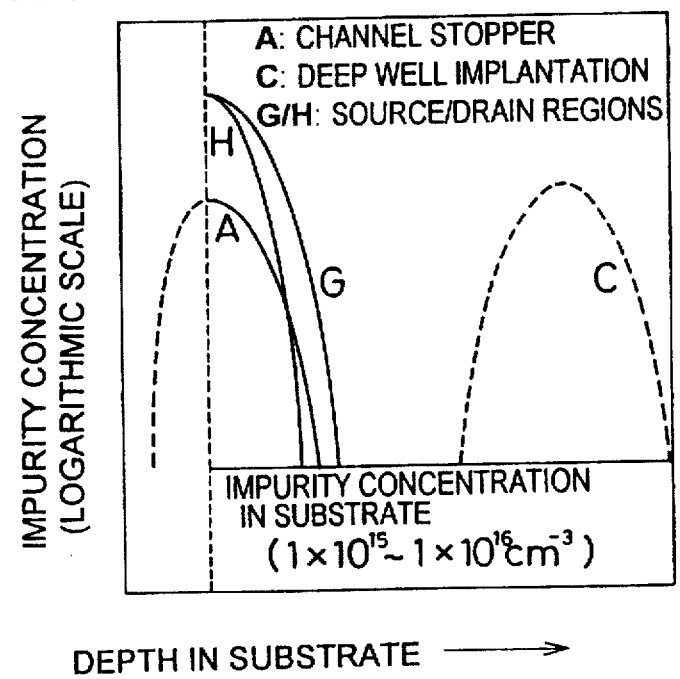
FIG. 12 is a graphical representation illustrating an impurity concentration distribution around source/drain regions of the MOS transistor of FIGS. 1(a) and 1(b)
Figure 13:
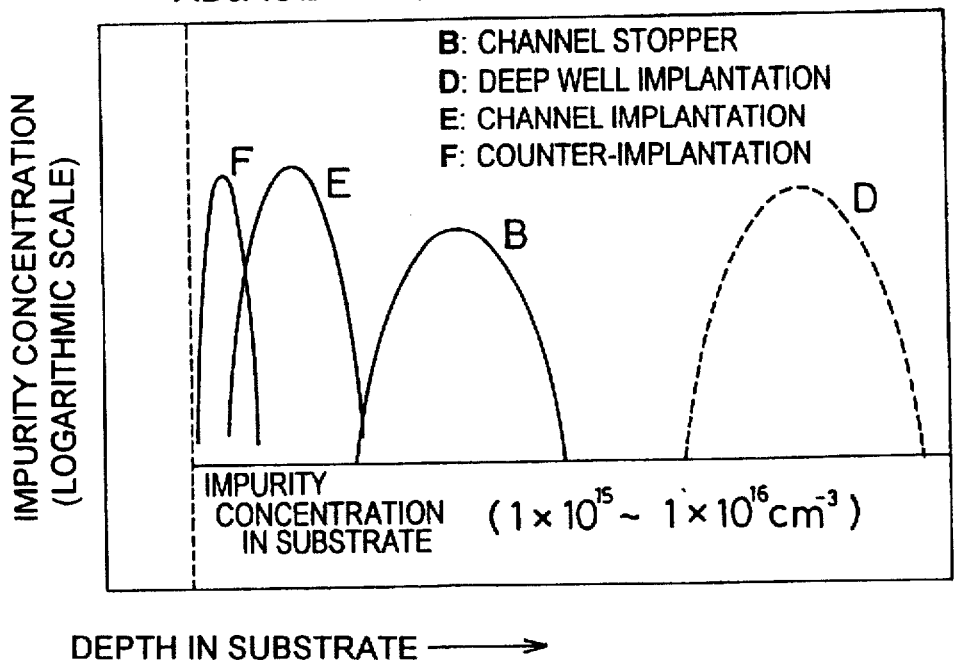
FIG. 13 is a graphical representation illustrating an impurity concentration distribution around a channel region of the MOS transistor of FIGS. 1(a) and 1(b)

In this manner, where the ion implantation is performed after the step (i), only one mask formation step is employed to independently control the distribution of the impurity concentration adjacent to the channel region and the distribution of the impurity concentration inside the semiconductor substrate in other regions. In general, the impurity concentration in regions adjacent to the channel region must be adjusted at a relatively high predetermined concentration level (e.g., about $1\times10^{17}$ cm$^{-3}$ or more when the gate length is 0.4 μm to 0.5 μm or less), depending on the gate length and the thickness of the gate insulating film, to control the threshold voltage and short channel effects of the transistor. The prior art method is not able to independently control the impurity concentrations under the source/drain regions and in the semiconductor substrate in other regions without an additional mask formation step. If ion implantation is performed without the additional mask formation step, regions adjacent to the source/drain regions and regions adjacent to the channel region have the same impurity concentration, whereby the capacitance at the junction of the source/drain regions is increased. Even if the addition mask formation step is employed to independently perform ion implantation in the vicinity of the channel region for the control of the impurity concentration, a sufficient alignment margin required in the mask formation step increases the overlap of the regions adjacent to the channel region and the regions adjacent to the source/drain regions, decreasing the effects of controlling the capacitance increase. However, the aforesaid ion implantation step according to the present invention makes it possible to form the region having a high impurity concentration only adjacent the channel region without the additional mask formation step, as shown in FIGS. 12 and 13. The ion implantation for the channel stopper permits the impurity ions to be implanted to a greater depth in a lower concentration than in the regions adjacent to the channel region, thereby exerting little effect on transistor characteristics. Further, the subsequent step of implanting ions for formation of the source/drain regions is performed so that the entire channel stopper region is covered (designated by a reference character G in FIG. 12) or at least the region having a high impurity concentration is covered (designated by a reference character H in FIG. 12), thereby remarkably reducing the impurity concentration under the source/drain regions to reduce the capacitance at the junction of the source/drain regions.

An MOS transistor and a fabrication process therefor according to the present invention will hereinafter be described with reference to the drawings.

Embodiment 1

Figure 1B:
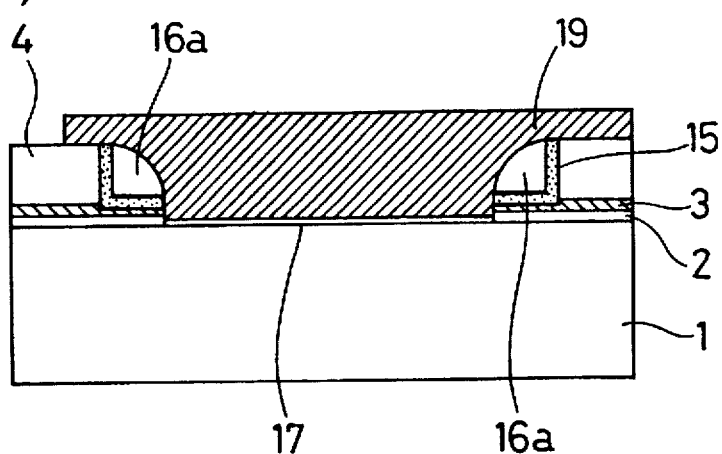

With reference to FIGS. 1(a) and 1(b), an MOS transistor according to the present invention mainly comprises a silicon substrate 1 serving as a semiconductor substrate, a gate electrode 19 on a gate insulating film 17 formed on a portion of the silicon substrate 1 defined by a field region, and source/drain regions 31. The field region includes a lower insulating film comprised of lamination of a silicon nitride film 3 and a silicon oxide film 2, and an upper insulating film comprised of a silicon oxide film 4. The gate electrode 19 is configured such that the gate length of its top surface is greater than that of its bottom surface facing a channel region. A sidewall spacer 16 is formed on a portion of the side wall of the gate electrode 19. The sidewall spacer 16 covers the outer periphery of the channel region and is made of the lower insulating film comprised of the silicon nitride film 3/the silicon oxide film 2, and a sidewall insulating layer comprised of an inner silicon oxide film 16a and an outer silicon nitride film 15. The source/drain regions 31 are substantially leveled with the channel region.

A process for fabricating the MOS transistor will next be described.

Referring to FIG. 2(a), the silicon oxide film 2 having a thickness of about 10 nm and the silicon nitride film 3 having a thickness of about 10 nm are formed as the lower insulating film on the silicon substrate 1 in this order by a thermal process or CVD process and by a CVD process, respectively. Then, the silicon oxide film 4 having a thickness of about 200 nm is formed as the upper insulating film on the lower insulating film.

Figure 7A:
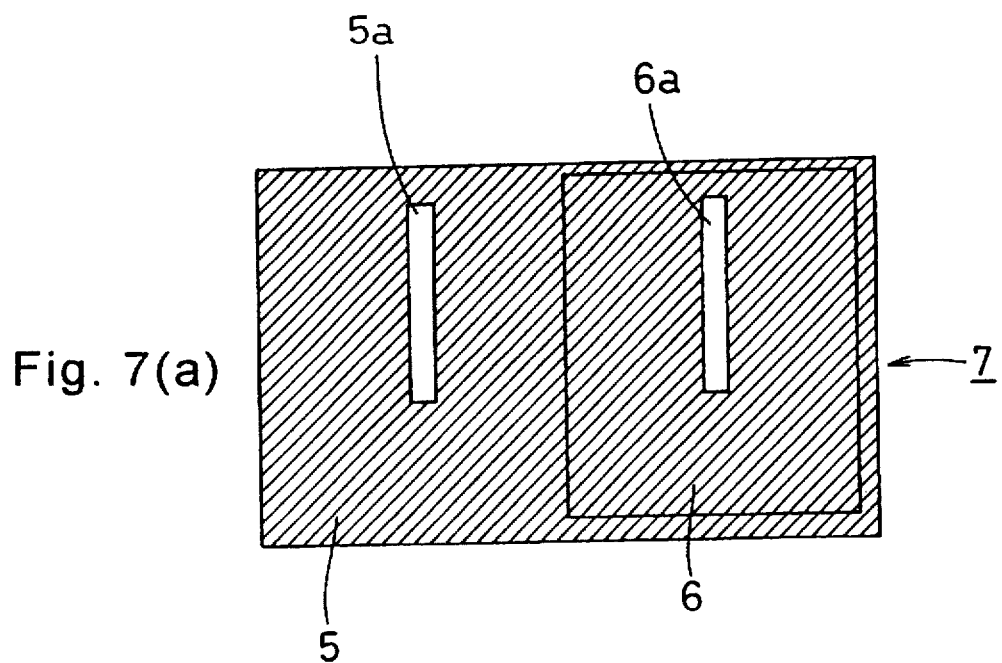
FIGS. 7(a), 7(b), 8(c) and 8(d) are plan views for explaining the configuration of resist masks to be used in the fabrication process for the MOS transistor of FIGS. 1(a) and 1(b)

Then, a resist pattern 7 (see FIG. 7(a)) including opening portions having minimum widths of 0.35 μm and 0.45 μm are formed in NMOS and PMOS channel regions 5a and 6a in the NMOS and PMOS transistor formation regions 5 and 6, respectively, by photolithographic and etching processes using an i-line stepper. By using the resist pattern 7 as a mask, the silicon oxide film 4 is etched by a reactive ion etching process employing the inductive plasma system to form openings in the silicon oxide film 4 on the respective channel regions 5a and 6a as shown in FIG. 2(b). This etching process in which the $SiO_2$/SiN selective etching ratio is 10 or more provides not more than about 6 nm etching amount of the silicon nitride film 3 even if about 30% overetching occurs in the etching of the silicon oxide film 4, permitting the silicon nitride film 3 to sufficiently function as an etching stopper. This prevents damages to the silicon substrate 1. The width of the channel regions 5a and 6a defined by this etching, along with the sidewall spacer to be formed in the subsequent step, determines the gate length.

Referring to FIG. 2(c), a resist 8 is deposited to cover the NMOS transistor formation region 5, and phosphorus ions 9 of an N-type impurity are implanted into the PMOS transistor formation region 6 in a dose of about $4\times10^{12}/cm^2$ at an implantation energy of about 180 keV so that the peak of implanted ion distribution is located near the surface of the silicon substrate 1 under the silicon oxide film 4. This ion implantation process serves as channel stopping implantation for the PMOS transistor. Since the silicon oxide film 4 is absent on the PMOS channel region 6a, the ions enter the inside of the silicon substrate 1. Then, to control the threshold voltage of the PMOS transistor of buried channel type, boron ions 10 of a P-type impurity are counter-implanted into a surface portion of the PMOS channel region 6a in the silicon substrate 1 in a dose of about $4\times10^{12}/cm^2$ at an implantation energy of about 7 keV, and arsenic ions 11 of an N-type impurity are implanted to a depth greater than the boron ions 10 in a dose of about $5\times10^{13}/cm^2$ at an implantation energy of about 180 keV. The boron ions 10 and the arsenic ions 11 enter the silicon oxide film, but hardly reach the surface of the silicon substrate 1 in regions other than the PMOS channel region 6a.

In turn, the resist 8 is removed, and a resist 12 is deposited to cover the PMOS transistor formation region 6 as shown in FIG. 2(d). Boron ions 13 are implanted into the NMOS transistor formation region 5 in a dose of $4\times10^{12}/cm^2$ at an implantation energy of about 65 keV so that the peak of implanted ion distribution is located near the surface of the silicon substrate 1 under the silicon oxide film 4. This ion implantation process serves as channel stopping implantation for the NMOS transistor. Since the silicon oxide film 4 is absent on the NMOS channel region 5a, the ions enter the inside of the silicon substrate 1. Then, to control the threshold voltage of the NMOS transistor of surface channel type, boron ions are implanted into a surface portion of the NMOS channel region 5a in the silicon substrate 1 in a dose of about $5\times10^{12}/cm^2$ at an implantation energy of about 7 keV, and then in a dose of about $1\times10^{13}/cm^2$ at an implantation energy of about 30 keV. The boron ions 13 enter the silicon oxide film 4, but hardly reach the surface of the silicon substrate 1 in regions other than the NMOS channel region 5a.

Figure 3E:
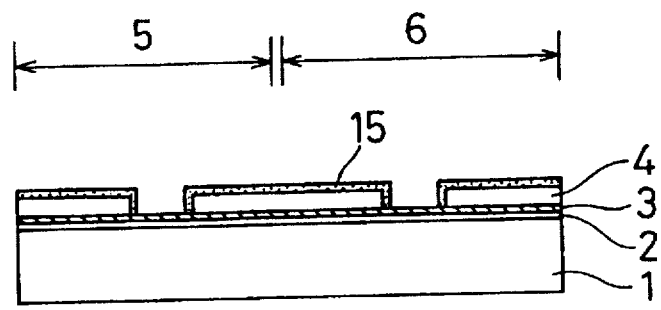

As shown in FIG. 3(e), a thin silicon nitride film 15 having a thickness of about 10 nm is formed on the entire surface of the resulting silicon substrate 1 including the silicon oxide film 4 having the openings.

Figure 3F:
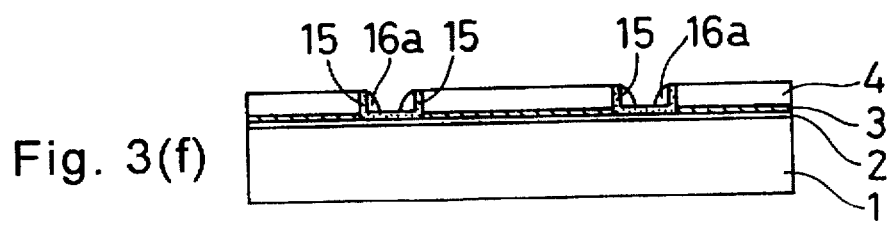

Referring to FIG. 3(f), a silicon oxide film having a thickness of about 120 mm is formed on the entire surface of the resulting substrate 1 by low pressure CVD, and is then anisotropically etched back by reactive ion etching so that silicon oxide films 16a remain only on the side walls of the openings in the silicon oxide film 4. At this time, the silicon oxide films 16a at the bottoms of the openings are about 100 nm in thickness.

Figure 3G:
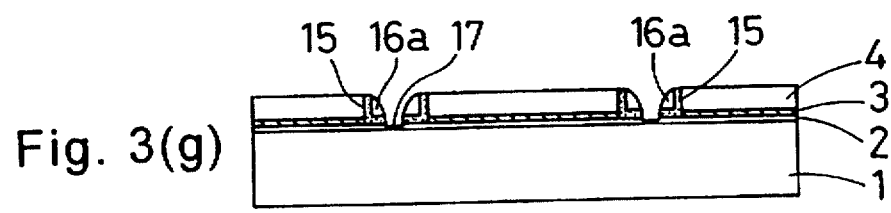

Portions of the silicon nitride film 15 which overlie the channel regions 5a and 6a and are not covered with the silicon oxide films 16a are etched away by reactive ion etching to form sidewall insulating films comprised of the silicon nitride films 15 and silicon oxide films 16a. Subsequently, the silicon nitride film 3 is etched away. This allows the silicon oxide film 2 to be exposed in the opening bottoms. The resulting silicon substrate 1 is subjected to a cleaning process, in which the silicon oxide film 2 in the opening bottoms is etched away with an aqueous solution of hydrofluoric acid for RCA cleaning. Then, as shown in FIG. 3(g), the gate insulating film 17 having a thickness of about 5 nm is formed by hydrochloric acid oxidation at about 800° C.

Figure 3H:
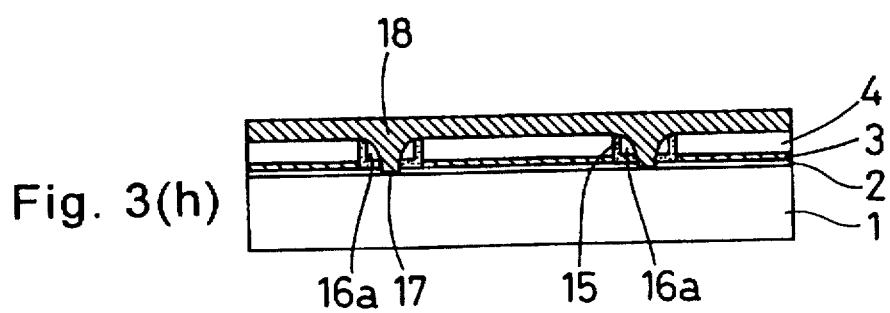

With reference to FIG. 3(h), a polysilicon film 18 having a thickness of about 200 nm is formed on the entire surface of the resulting silicon substrate 1 by a known low pressure CVD process. Then, phosphorus ions of an N-type impurity are diffused in a concentration of about $1\times10^{20}/cm^3$ to about $2\times10^{20}/cm^3$ by a known technique.

Figure 7B:
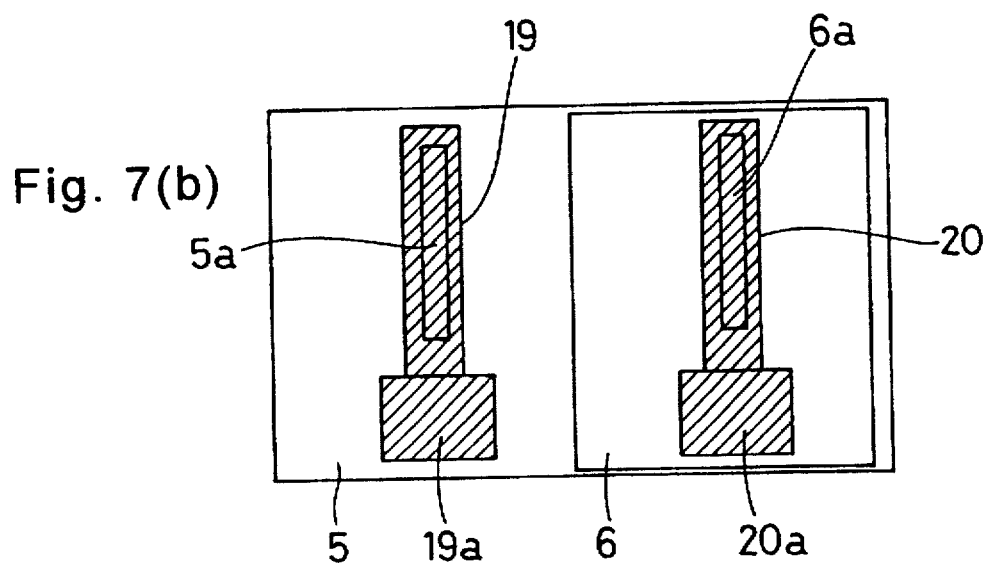

In turn, a resist pattern is formed by known lithographic and etching processes. By using the resist pattern as a mask, the polysilicon film 18 is patterned by reactive ion etching as shown in FIG. 4(i) to form NMOS and PMOS transistor gate electrodes 19 and 20 having the widths of 0.45 μm and 0.55 μm, respectively, which are greater by 0.1 μm than the opening widths to completely cover the openings. The patterns of the gate electrodes 19 and 20 include connection portions 19a and 20a to external interconnection lines or interconnection lines to gate electrodes of other transistors formed outside the channel regions 5a and 6a (see FIG. 7(b)).

Figure 8C:
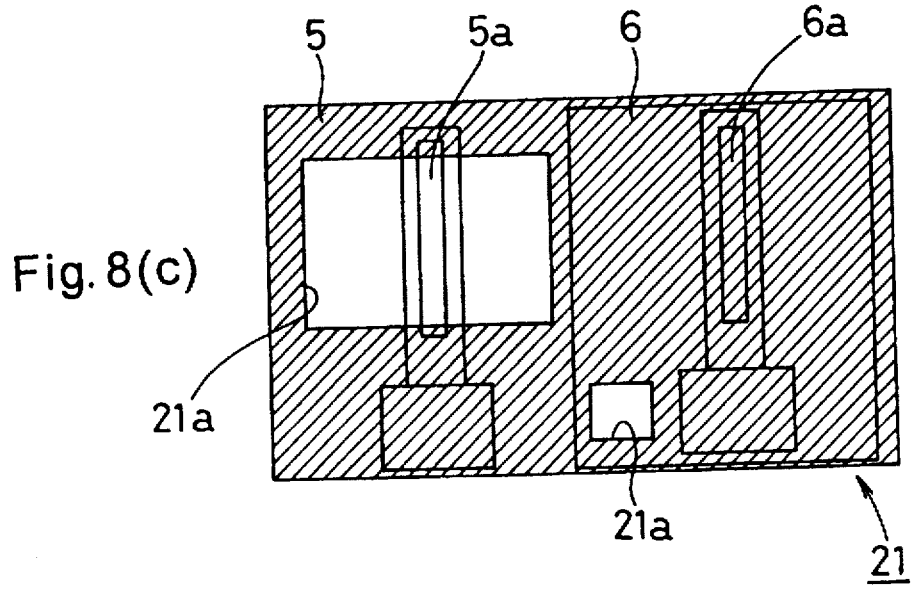

As shown in FIG. 4(j), a resist pattern 21 (FIG. 8(c)) having opening portions 21a in the NMOS transistor formation region 5 and the PMOS transistor formation region 6 is formed on the resulting substrate by photolithographic and etching processes. An opening portion 21a formed in the NMOS transistor formation region 5 (serving as the source/drain regions of the NMOS transistor) must not contain the ends of the channel region 5a. An opening portion 21a formed in the PMOS transistor formation region 6 (serving as a contact region) must not overlap the channel region 6a nor the gate electrode 20. By using the resist pattern 21 as a mask, the silicon oxide film 4 is etched away to form an oxide film opening portion 22. At this time, the etching of the silicon oxide film 4 preferably stops at the silicon nitride film 3.

Referring to FIG. 4(k), with the resist 21 left, the silicon oxide film 4 is etched with an aqueous solution of HF to remove a portion of the silicon oxide film 4 remaining under the gate electrode 19. This allows the gate electrode 19 to have an overhanging configuration extending outwardly from the silicon nitride film 15 if no misalignment occurs. By using the resist pattern 21 as a mask, arsenic ions are implanted in a dose of $4\times10^{15}/cm^2$ at an implantation energy of 90 keV at an angle of 35° with respect to a normal to the substrate surface to form an arsenic implanted layer 25. The implantation process is divided into four 90-degree steps in this embodiment, but may be divided into eight 45-degree steps. In this embodiment, the overhanging amount of the gate electrode 19 is 0.15 μm in the worst case, since a maximum pattern offset during the patterning of the gate electrode 19 is 0.1 μm and the overhanging amount, if no pattern offset occurs, is 0.05 μm. Since the height of the gate electrode 19 is 0.22 μm, the implantation angle $\theta_1$ is 34.3 degrees which is determined from the following relation:

tan $\theta_1$=0.15/0.22.

As shown in FIG. 4(l), with the resist 21 left, arsenic ions are implanted in a dose of about $1\times10^{13}/cm^2$ at an implantation energy of about 150 keV at an angle of about 60° with respect to the normal to the substrate surface to form an arsenic implanted layer 26 of a low concentration. The implantation process is divided into four 90-degree steps. This ion implantation process is desirably performed at an angle greater than the angle $\theta_2$ at which arsenic ions are implanted into a region under the sidewall insulating layer comprised of the silicon nitride film 15 and the silicon oxide film 16a even if the pattern of the gate electrode 19 is offset by a maximum amount from the channel pattern due to misalignment and a difference in lens distortion between exposure machines to increase the overhanging amount to the maximum. The maximum amount of the pattern offset in this case is 0.1 μm, and the overhanging amount, if no offset occurs, is 0.05 μm. Thus, the overhanging amount at the worst is 0.15 μm. Provided that the thickness of the side wall, the height of the gate electrode and an intended ion implantation depth are 0.1 μm, 0.22 μm and 0.03 μm, respectively, the implantation angle $\theta_2$ is 45.0 degrees which is determined from the following relation:

tan $\theta_2$=(0.1+0.1+0.05)/(0.22+0.03)=0.25/0.25.

Figure 5M:
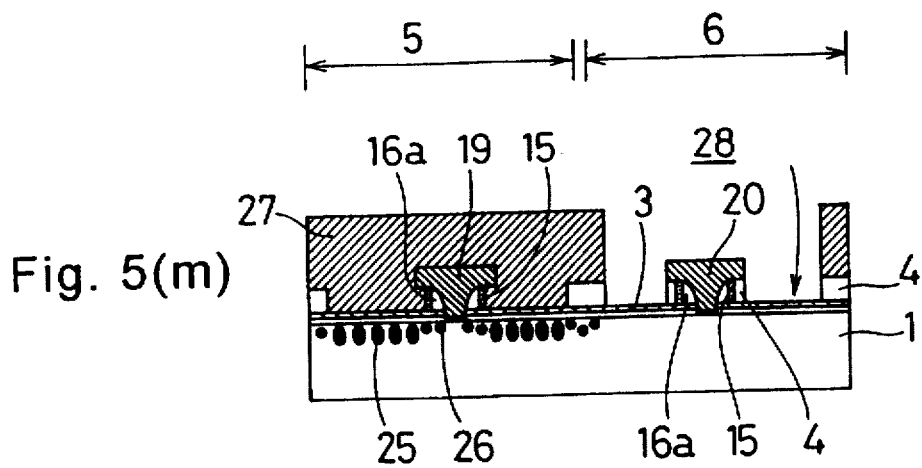
Figure 8D:
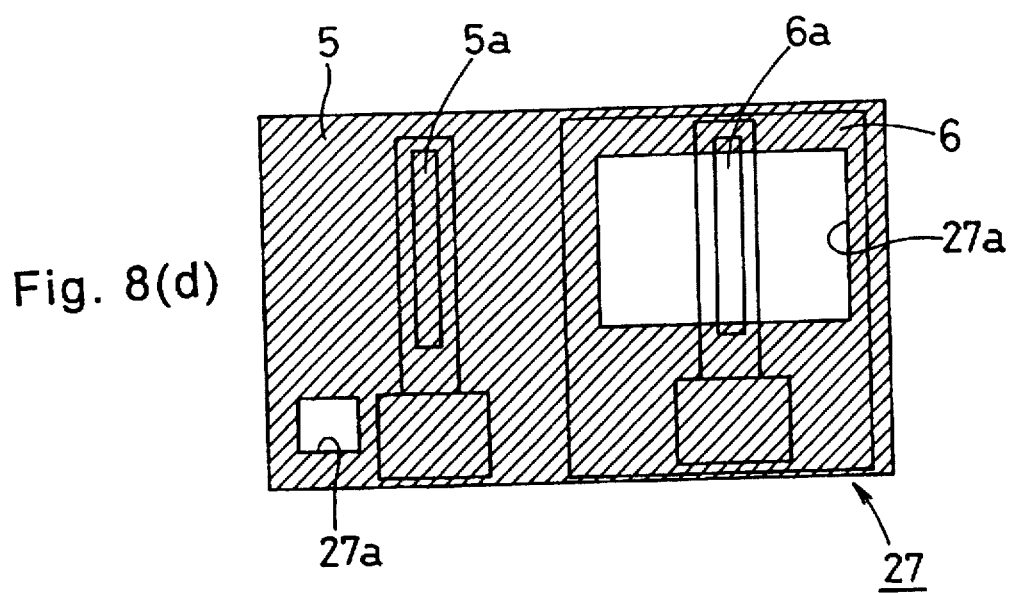

With reference to FIG. 5(m), a resist pattern 27 (FIG. 8(d)) having opening portions 27a in the PMOS and NMOS transistor formation regions 5 and 6 is formed in substantially the same manner as shown in FIGS. 4(j) and 8(c). An opening portion 27a formed in the PMOS transistor formation region 6 (serving as the source/drain of the PMOS transistor) must not contain the ends of the channel region 6a. An opening portion 27a formed in the NMOS transistor formation region 5 (serving as a contact region) must not overlap the channel region 5a nor the gate electrode 19. By using the resist pattern 27 as a mask, the silicon oxide film 4 is etched away to form an oxide film opening portion 28.

Figure 5N:
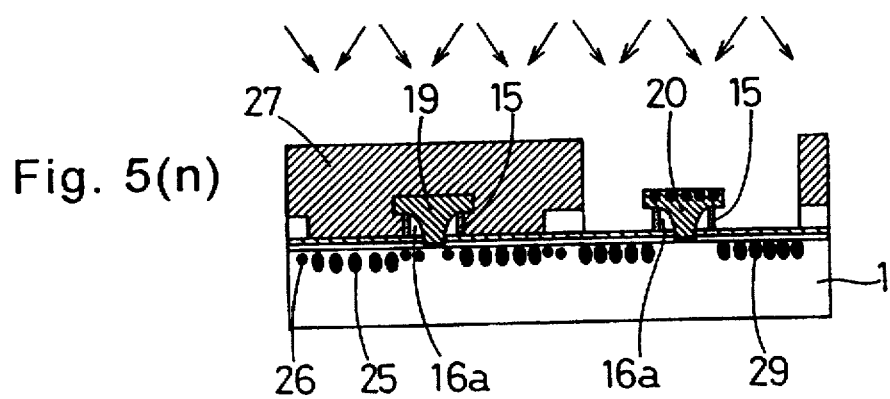

As shown in FIG. 5(n), with the resist 27 left, the silicon oxide film 4 is etched with an aqueous solution of HF to remove a portion of the silicon oxide film 4 remaining under the gate electrode 20. This allows the gate electrode 20 to have an overhanging configuration extending outwardly from the silicon nitride film 15 if no misalignment occurs. By using the resist pattern 27 as a mask, boron ions are implanted in a dose of about $4\times10^{15}/cm^2$ at an implantation energy of 15 keV at an angle of 35° with respect to the normal to the substrate surface to form a boron implanted layer 29. The implantation process is divided into four 90-degree steps. If misalignment to the worst extent occurs, a region having a width of about 0.05 μm to about 0.1 μm cannot be formed into a $P^+$ region and has an increased resistance, since a diffusion region is to be formed only by $P^-$ implantation as will be described later. However, the voltage drop due to the resistance increase is as small as 0.1 V, presenting no large problem in terms of logic operation.

Figure 5O:
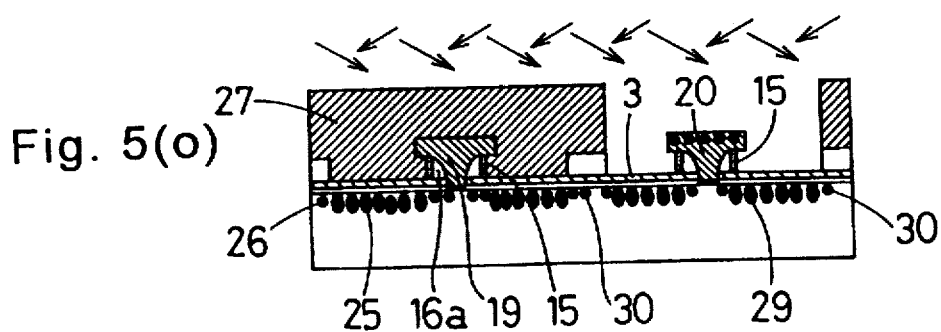

As shown in FIG. 5(o), with the resist 27 left, boron ions are implanted in a dose of about $8\times10^{13}/cm^2$ at an implantation energy of about 25 keV at an angle of about 60° with respect to the normal to the substrate surface to form a boron implanted layer 30 of a low concentration. The implantation process is divided into four 90-degree steps.

Figure 6P:
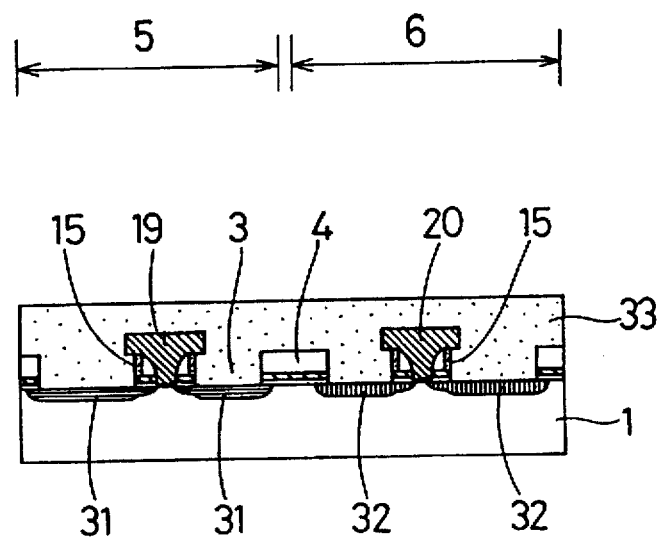

As shown in FIG. 6(p), heat treatment is performed at 850° C. for 30 minutes to form $N^+$ source/drain regions 31 and $P^+$ source/drain regions 32 having an LDD structure, and an interlayer insulating film 33 is formed by plasma CVD.

Figure 6Q:
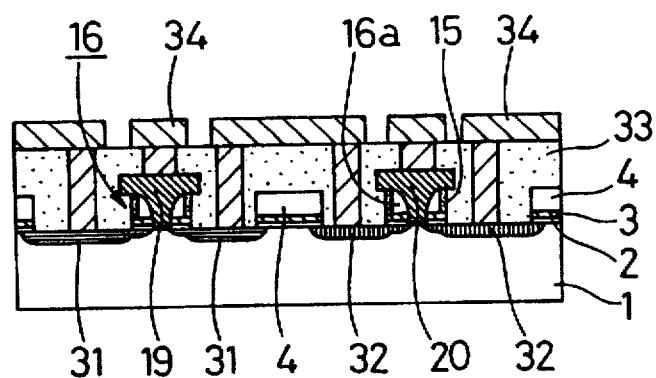

Finally, contact holes are formed in the interlayer insulating film 33, and a metal interconnection 34 is formed as shown in FIG. 6(q).

The fabrication process described above according to this embodiment achieves the formation of the NMOS transistor having a gate length of 0.15 μm (effective gate length of about 0.1 μm) and the PMOS transistor having a gate length of 0.25 μm (effective gate length of about 0.1 μm).

As described above, the fabrication process of this embodiment can achieve the formation of the transistors without using a special facility such as an electron beam exposure apparatus requiring a high fabrication cost. The polysilicon electrode forming the gate electrode has a width of 0.45 μm which is three times a 0.15 μm-wide gate electrode formed by the prior art process and, therefore, has a resistance reduced to one-third. In this embodiment, the channel region having a relatively high concentration (up to $1\times10^{18}/cm^3$) required to control the threshold voltage is formed only under the channel region, and the surface portions of the substrate serving as the source/drain regions have a relatively low impurity concentration ($1\times10^{16}$/cm$^3$ to $1\times10^{17}$/cm$^3$). This remarkably reduces the source-drain capacitance to one-third to one-tenth, which is very effective to improve the operating rate of the circuit. Further, the fabrication process of this embodiment requires eight lithographic process steps for the formation of the channel region formation pattern, the gate electrode pattern, the N well region, the P well region, the N$^+$ region, the P$^+$ region, the contact pattern and the metal pattern to form a significantly simplified CMOS circuit.

Further, in the fabrication process of this embodiment, the lithographic process for determining the gate length is performed on a completely flat structure. Therefore, the transistors having the above stated structure is virtually free from such a problem as a locally narrowed pattern which may otherwise occur in a conventional case where the gate electrode pattern is formed by a lithographic process after the formation of an uneven LOCOS oxide film pattern serving as a device isolation region. Thus, the gate length can be readily controlled with a high accuracy.

Embodiment 2

Embodiment 2 is substantially the same as the Embodiment 1, except that the step of the ion implantation into the channel region and the step of the formation of the sidewall spacer is interchanged.

First, the channel regions 5a and 6b are formed in the NMOS and PMOS transistor formation regions 5 and 6, respectively, in the same manner as shown in FIGS. 2(a) and 2(b). The silicon nitride film 15 is formed as shown in FIG. 3(e), and then the silicon oxide films 16a are formed as shown in FIG. 3(f).

Referring to FIGS. 2(c) and 2(d), impurity ions are implanted into the PMOS transistor formation region 6 and, further, impurity ions are implanted into the NMOS transistor formation region 5. Since the ions are not implanted into a surface portion of the silicon substrate 1 which underlies the sidewall insulating layers comprised of the silicon nitride films 15 and silicon oxide films 16a, the region having a relatively high concentration for determining the threshold voltage of the transistor is narrowed, further improving the effect of reducing the source/drain capacitance. In this case, however, the channel region to be ion-implanted is narrowed and promotes the lateral impurity diffusion to increase the liability to a reduction in the impurity concentration in the central portion of the channel region. Therefore, the dose of ion implantation should be increased in comparison with Embodiment 1. For example, phosphorus ions 9 of an N-type impurity are implanted in a dose of about $4\times10^{12}$/cm$^2$ at an implantation energy of about 180 keV so that the peak of implanted ion distribution is located adjacent the surface of the silicon substrate 1 under the silicon oxide film 4. Thereafter, to control the threshold voltage of the PMOS transistor of the buried channel type, boron ions 10 of a P-type impurity are counter-implanted into a portion of the silicon substrate 1 adjacent to the surface of the PMOS channel region 6a in a dose of about $4.4\times10^{12}$/cm$^2$ at an implantation energy of about 7 keV, and arsenic ions 11 of an N-type impurity are implanted to a greater depth than the boron ions 10 in a dose of about $6\times10^{13}$/cm$^2$ at an implantation energy of about 180 keV (see FIG. 2(c)).

Boron ions 13 are implanted into the NMOS transistor formation region 5 in a dose of about $4\times10^{12}$/cm$^2$ at an implantation energy of about 65 keV so that the peak of implanted ion distribution is located adjacent the surface of the silicon substrate 1 under the silicon oxide film 4. Subsequently, to control the threshold voltage of the NMOS transistor of the surface channel type, boron ions of a P-type impurity are implanted into a portion of the silicon substrate 1 adjacent to the surface of the NMOS channel region 5a in a dose of about $6\times10^{12}$/cm$^2$ at an implantation energy of about 7 keV and then in a dose of about $1.2\times10^{13}$/cm$^2$ at an implantation energy of about 30 keV (see FIG. 2(d)).

The subsequent steps are performed in the same manner as shown in FIGS. 3(g) to 6(q) to complete the MOS transistor.

Embodiment 3

Embodiment 3 is substantially the same as Embodiment 1, except that the PMOS transistor is of a surface channel type.

Figure 14A:
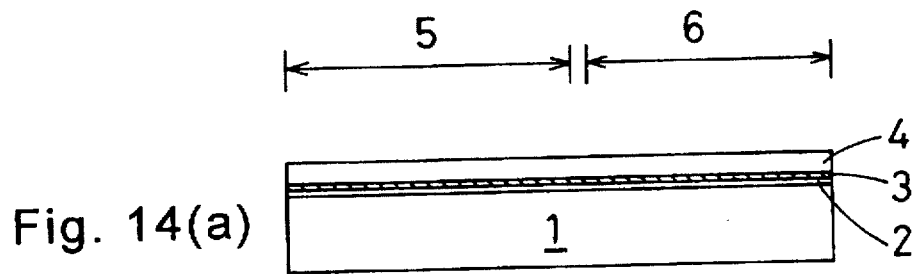

Referring to FIG. 14(a), the oxide film 2, the silicon nitride film 3 and the silicon oxide film 4 are sequentially formed on the silicon substrate 1 in the same manner as in Embodiment 1.

Figure 14B:
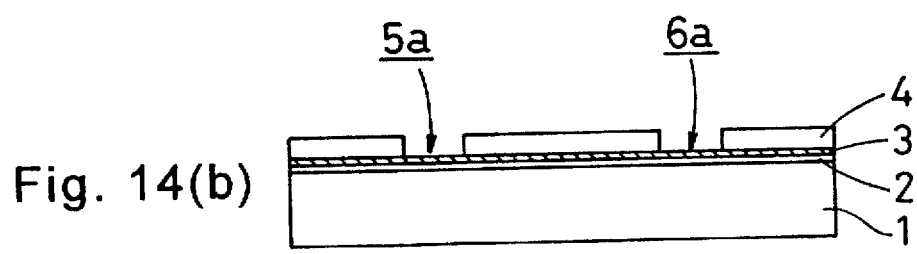

As shown in FIG. 14(b), openings each having a minimum width of 0.35 μm are formed in substantially the same manner as in Embodiment 1 in the silicon oxide film 4 in the NMOS and PMOS channel regions 5a and 6a (serving as channels) of the NMOS and PMOS transistor formation regions 5 and 6, respectively. The PMOS transistor of the surface channel type exhibits a suppressed short-channel effect in comparison with a transistor of the buried channel type, so that the minimum gate length thereof can be reduced in comparison with Embodiment 1.

Figure 14C:
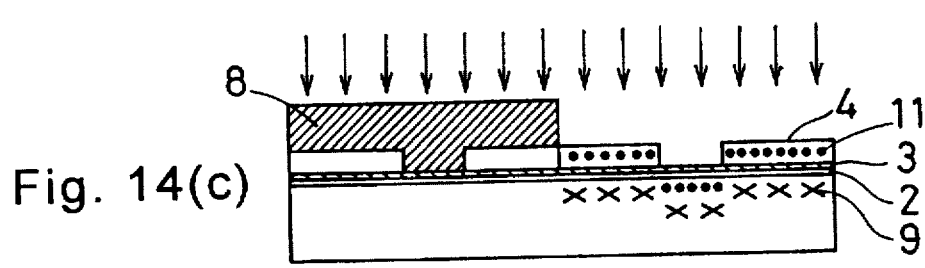

As shown in FIG. 14(c), a resist 8 is deposited to cover the NMOS transistor formation region 5, and phosphorus ions 9 of an N-type impurity are implanted into the PMOS transistor formation region 6 in a dose of about $4\times10^{12}$/cm$^2$ at an implantation energy of about 180 keV so that the peak of implanted ion distribution is located adjacent the surface of the silicon substrate 1 under the silicon oxide film 4. Then, to control the threshold voltage of the PMOS transistor of the surface channel type, arsenic ions 11 of an N-type impurity are implanted into a portion of the silicon substrate 1 adjacent to the surface of the PMOS channel region 6a in a dose of about $6\times10^{12}$/cm$^2$ at an implantation energy of about 30 keV, and phosphorus ions are implanted therein in a dose of about $1\times10^{13}$/cm$^2$ at an implantation energy of about 80 keV (or arsenic ions may be implanted therein in a dose of about $1\times10^{13}$/cm$^2$ at an implantation energy of about 180 keV instead).

Figure 14D:
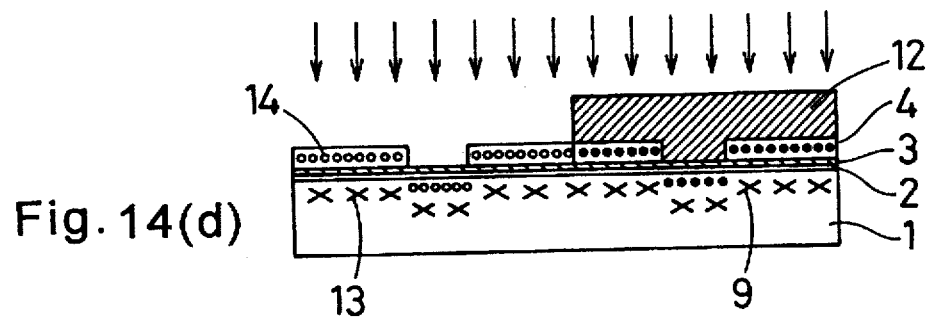

The resist 8 is removed, and a resist 12 is deposited to cover the PMOS transistor formation region 6 in the same manner as in Embodiment 1 as shown in FIG. 14(d). Boron ions 13 are implanted into the NMOS transistor formation region 5 in a dose of about $4\times10^{12}$/cm$^2$ at an implantation energy of about 65 keV so that the peak of implanted ion distribution is located adjacent the surface of the silicon substrate 1 under the silicon oxide film 4. Subsequently, to control the threshold voltage of the NMOS transistor of surface channel type, boron ions of a P-type impurity are implanted into a portion of the silicon substrate 1 adjacent to the surface of the NMOS channel region 5a in a dose of about $5\times10^{12}$/cm$^2$ at an implantation energy of about 7 keV, and then in a dose of about $1\times10^{13}$/cm$^2$ at an implantation energy of about 30 keV.

As shown in FIG. 15(e), the silicon nitride film 15 are formed on the entire surface of the resulting silicon substrate 1 in the same manner as in Embodiment 1.

The silicon oxide films 16a are left only on the side walls of the openings in the silicon oxide film 4 in the same manner as in Embodiment 1 as shown in FIG. 15(f).

Portions of the silicon nitride film 15 which overlies the channel regions 5a and 6a and are not covered with the silicon oxide films 16a are etched away by reactive ion etching to form the sidewall insulating films comprised of the silicon nitride films 15 and the silicon oxide films 16a. Then, the silicon nitride film 3 is etched away. This allows the silicon oxide film 2 to be exposed in the bottoms of the openings.

As shown in FIG. 15(g), the gate insulating film 27 is formed. Then, annealing is performed in an atmosphere of $N_2O$ at a temperature of 800° C. to 1000° C. for about 5 minutes to about one hour to cause the gate insulating film 27 to contain one- to several-percent nitrogen at the interface of the gate insulating film 27 and the silicon substrate 1. This prevents fluctuation of the threshold voltage of the transistor which may otherwise be caused due to diffusion of boron ions into the channel through the gate insulating film 27 because the gate electrode of the PMOS transistor is formed of boron-diffused polysilicon in the subsequent step.

With reference to FIG. 15(h), polysilicon 18 is deposited on the entire substrate of the resulting silicon substrate 1 by a known low pressure CVD process. Since ion implantation into the gate electrode is performed simultaneously with the ion implantation for formation of the source/drain regions, no impurity diffusion process is performed after the deposition of the polysilicon 18.

As shown in FIG. 16(i), the polysilicon film 18 is patterned to form an NMOS transistor gate electrode 39 and a PMOS transistor gate electrode 40 in the same manner as in Embodiment 1.

Figure 18A:
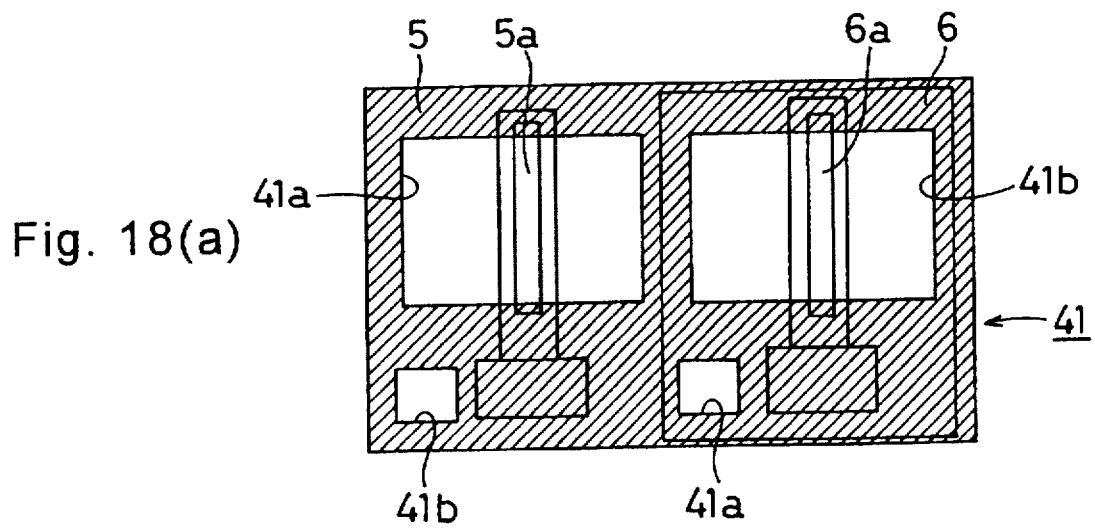
FIGS. 18(a) to 18(c) are plan views for explaining the configuration of resist masks to be used in the second fabrication process for the MOS transistor according to the present invention.

A resist pattern 41 (FIG. 18(a)) having opening portions 41a and 41b in the NMOS and PMOS transistor formation regions 5 and 6, respectively, is formed by a photolithographic and etching process. An opening portion 41a formed in the NMOS transistor formation region 5 (serving as the source/drain of the NMOS transistor) does not contain the ends of the channel region 5a. An opening portion 41a formed in the PMOS transistor formation region 6 (serving as a contact region) does not overlap the channel region 6a nor the gate electrode 40. An opening portion 41b formed in the PMOS transistor formation region 6 (serving as the source/drain of the PMOS transistor), does not contain the ends of the channel region 6a. An opening portion 41b formed in the NMOS transistor formation region 5 (serving as a contact region) does not overlap the channel region 5a nor the gate electrode 39. By using the resist pattern 41 as a mask, the silicon oxide film 4 is etched away to form oxide film opening portions 42. This allows the gate electrode 30 to have an overhanging configuration extending outwardly from the silicon nitride film 15 if no misalignment occurs.

Figure 18B:
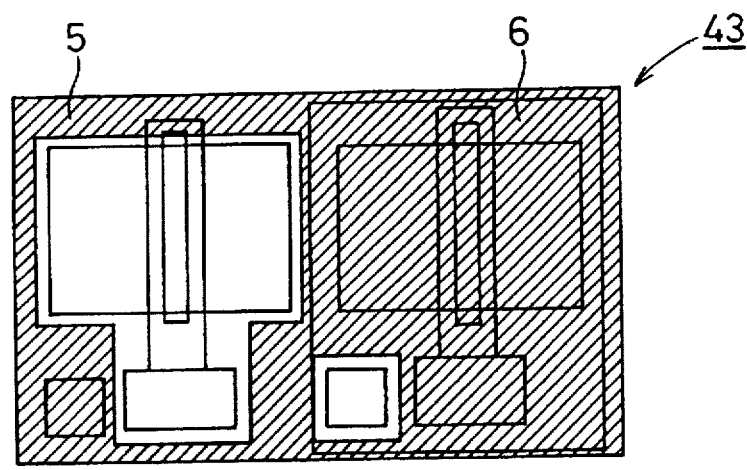

Referring to FIG. 16(k), a resist pattern 43 (FIG. 18(b)) having openings in the NMOS and PMOS transistor formation regions 5 and 6 is formed by a photolithographic and etching process. By using the resist pattern 43 as a mask, arsenic ions are implanted in a dose of about $4 \times 10^{15}/cm^2$ at an implantation energy of 90 keV at an angle of 35° with respect to the normal to the substrate surface to form an arsenic implanted layer 44.

As shown in FIG. 16(l), with the resist 43 left, arsenic ions are implanted in a dose of about $1 \times 10^{13}/cm^2$ at an implantation energy of about 150 keV at an angel of about 60° with respect to the normal to the substrate surface to form an arsenic implanted layer 45 of a low concentration.

Figure 17M:
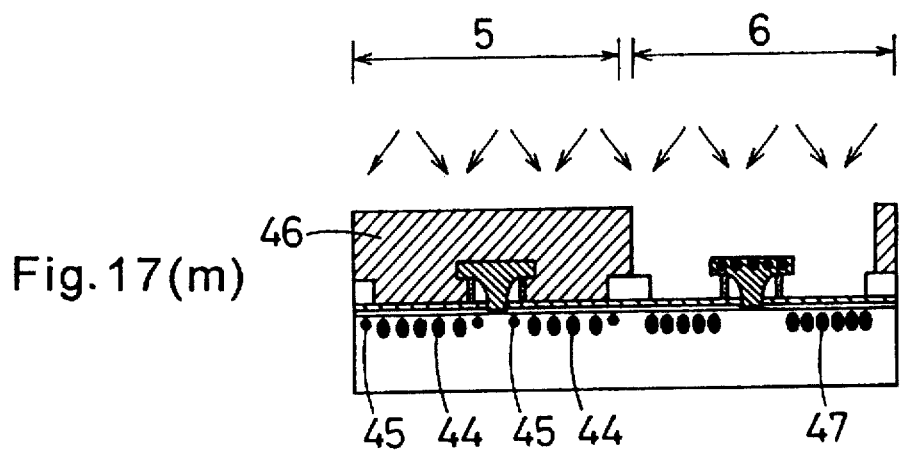
Figure 18C:
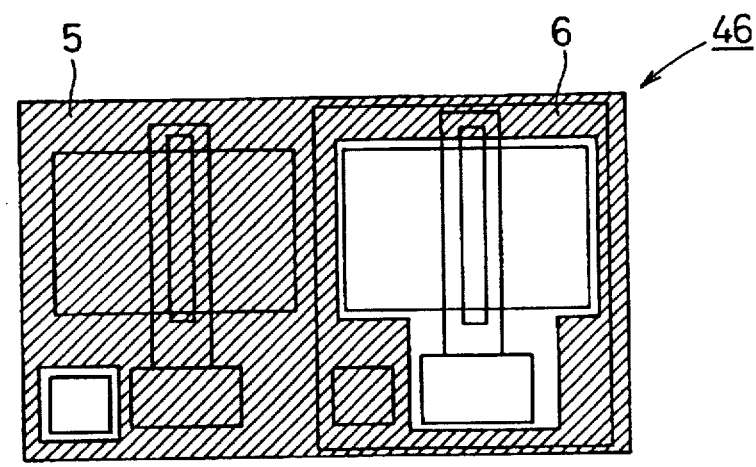

The resist pattern 43 is removed, and a resist pattern 46 (FIG. 18(c)) having openings in the PMOS and NMOS transistor formation regions 6 and 5 is formed by a photolithographic and etching process as shown in FIG. 17(m). By using the resist pattern 46 as a mask, boron ions are implanted in a dose of about $4 \times 10^{15}/cm^2$ at an implantation energy of 15 keV at an angle of 35° with respect to the normal to the substrate surface to form a boron implanted layer 47.

Figure 17N:
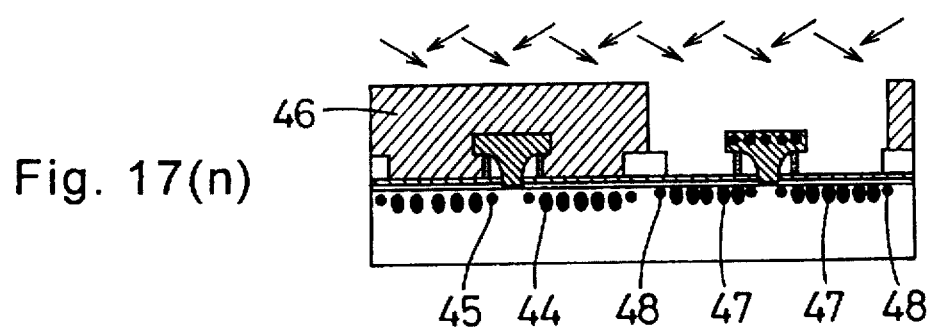

As shown in FIG. 17(n), with the resist 46 left, boron ions are implanted in a dose of about $8 \times 10^{13}/cm^2$ at an implantation energy of about 25 keV at an angle of about 60° with respect to the normal to the substrate surface to form a boron implanted layer 48 of a low concentration.

Figure 17O:
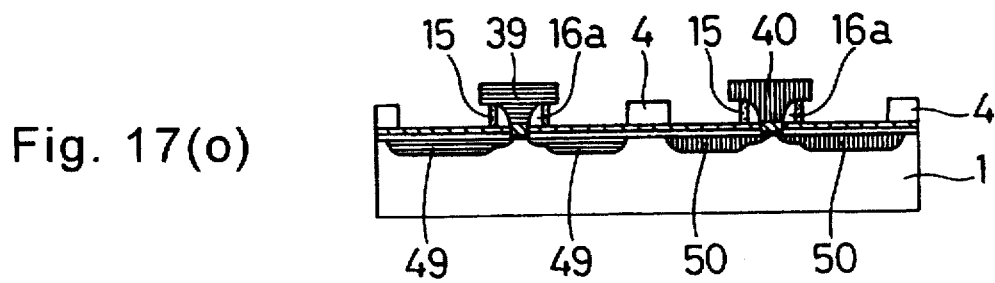

Further, as shown in FIG. 17(o), heat treatment is performed in the same manner as in Embodiment 1 to form $N^+$ source/drain regions 49 and $P^+$ source/drain regions 50 having an LDD structure and to form the $N^+$ gate electrode 39 doped negative as the gate electrode of the NMOS transistor and the $P^+$ gate electrode 40 doped positive as the gate electrode of the PMOS transistor.

The MOS transistor of Embodiment 3 is substantially the same as that of Embodiment 1, but includes the PMOS transistor having a reduced gate length of 0.15 µm to improve a drive current and a PMOS gate capacitance reduced by about 40%. The fabrication process of this embodiment, however, requires nine lithographic process steps for formation of the channel pattern, the gate pattern, the N well region, the P well region, the implanted region, the $N^+$ region, the $P^+$ region, the contact pattern and the metal pattern, which are greater in number by one than the lithographic process steps of Embodiment 1.

Embodiment 4

Embodiment 4 is substantially the same as the MOS transistor of Embodiment 3, except that a high-melting-point metal silicide layer is formed on the source/drain regions and the gate electrode in a self-alignment manner.

More specifically, the $N^+$ source/drain regions 49 and $P^+$ source/drain regions 50 having an LDD structure are formed in the same manner as in Embodiment 3 shown in FIGS. 14(a) to 17(o).

Figure 19A:
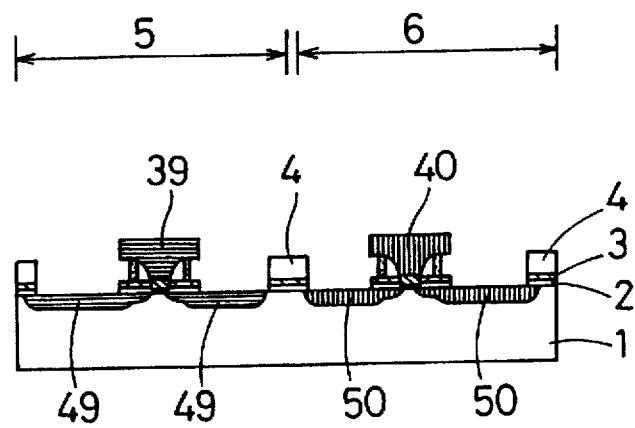
FIGS. 19(a) and 19(b) are schematic sectional views illustrating a third fabrication process for the MOS transistor according to the present invention.

Referring to FIG. 19(a), the silicon nitride film 3 on the source/drain regions 49 and 50 or in the oxide film opening portions 42 is etched away by dry etching. In this step, it is desirable that the etching amount of the gate electrodes 39 and 40 and the silicon oxide film 4 is reduced as much as possible. In this embodiment, the conditions which ensure a great selective etching ratio to silicon are employed to minimize the etching of the gate electrodes 39 and 40, but allow slight etching of the silicon nitride film 3. Then, the remaining silicon oxide film 2 is etched with an aqueous solution of HF to expose the surface of the silicon substrate 1.

Figure 19B:
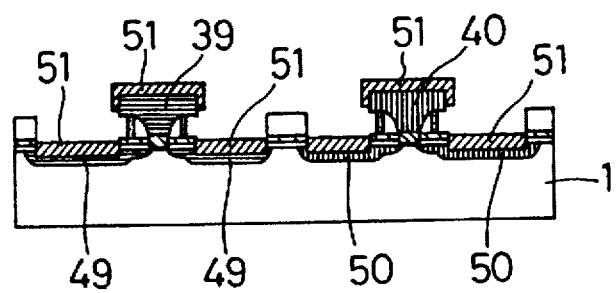

A titanium thin film having a thickness of about 10 nm to about 50 nm is formed on the entire surface of the resulting silicon substrate 1 by sputtering, and heat treatment is performed in an atmosphere of nitrogen at a temperature in a range between 600° C. and 700° C. for about 10 seconds to 60 seconds. The resulting silicon substrate 1 is immersed in a solution mixture containing sulfuric acid and hydrogen peroxide to dissolve titanium on the silicon oxide film 4, so that titanium silicide layers 51 are formed on silicon or only on the gate electrodes 39 and 40 and the source/drain regions 49 and 50, as shown in FIG. 19(b). The subsequent steps of this embodiment are the same as those of Embodiment 3.

In this embodiment, the gate electrodes of silicide exhibits a much lower resistance than the polysilicon electrodes. Although it is known that a titanium silicide gate electrode having a decreased gate length has an increased resistance, the present invention solves this problem because the gate electrode width is greater than the gate length. In addition, this embodiment can readily employ the salicide technique, since the gate electrodes are not covered with the insulating film and the source/drain regions are covered with the very thin insulating film. Other features of Embodiment 4 are the same as those of Embodiment 3.

Embodiment 5

Embodiment 5 is substantially the same as Embodiment 4, except that the high-melting-point silicide layer is formed in a different manner.

The gate electrodes 39 and 40 are formed in the same manner as in Embodiment 3 shown in FIGS. 14(a) to 16(j).

Figure 20A:
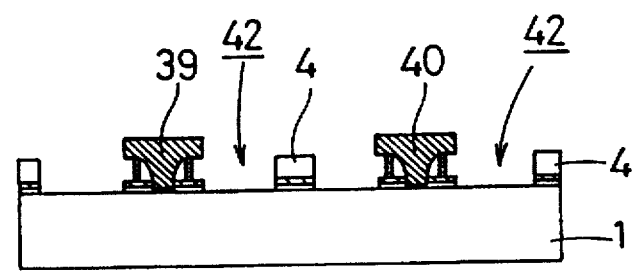
FIGS. 20(a) and 20(b) are schematic sectional views illustrating a fourth fabrication process for the MOS transistor according to the present invention.

Referring to FIG. 20(a), the silicon nitride film 3 on the regions where the source/drain regions are to be formed, or in the oxide film opening portions 42, is etched away by dry etching. Then, the remaining silicon oxide film 2 is etched with an aqueous solution of HF to expose the surface of the silicon substrate 1.

Figure 20B:
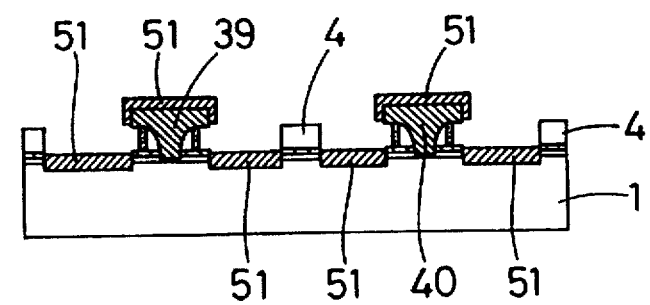
Figure 21A:
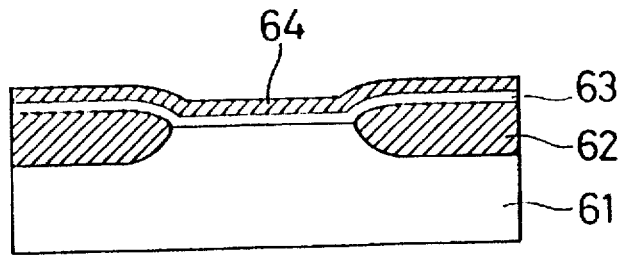
FIGS. 21(a) to 21(d) are schematic sectional views illustrating a fabrication process of a conventional MOS transistor.
Figure 21B:
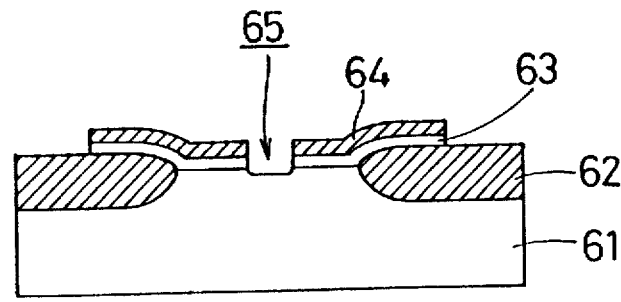
Figure 21C:
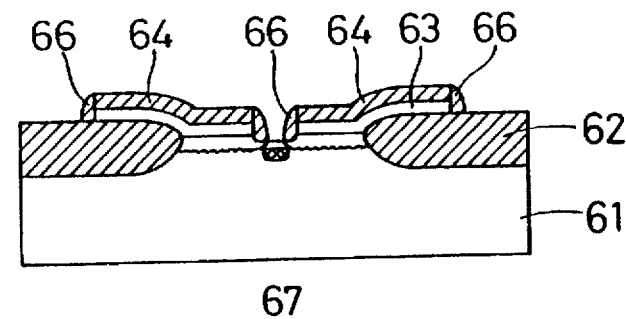
Figure 21D:
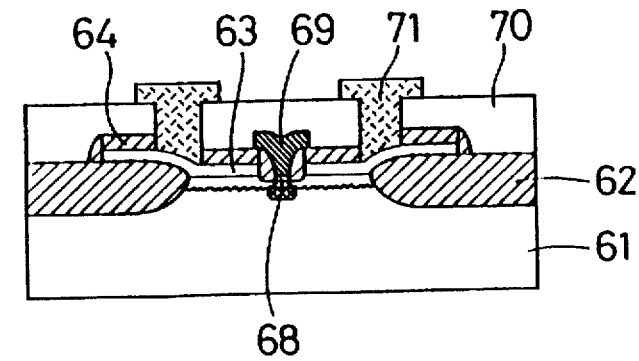

A titanium thin film is formed on the entire surface of the silicon substrate 1, then heat treatment is performed, and the resulting silicon substrate 1 is etched with a solution mixture containing sulfuric acid and hydrogen peroxide in the same manner as in Embodiment 4. Thus, the titanium silicide layers 51 are formed only on the gate electrodes 39 and 40 and the source/drain regions 49 and 50 as shown in FIG. 20(b).

The subsequent steps are performed in the same manner as in Embodiment 3 shown in FIGS. 16(k) to 17(n) to complete the MOS transistor shown in FIG. 19(b).

In the MOS transistor according to the present invention, the gate electrode is configured such that the gate length of the top surface thereof is greater than the gate length of the bottom surface thereof facing the channel region. The sidewall spacer is formed in contact with the side wall of the gate electrode to cover the outer periphery of the channel region. This allows for the fabrication of the MOS transistor having an extremely small and stable gate length without being restricted by the limitation of the photolithographic technique which is used in the fabrication process steps. That is, an extremely small MOS transistor can be provided by using the conventional 0.35 µm–0.4 µm microlithographic technique without remarkably increasing the process steps. Further, the parasitic capacitance in the source/drain regions can be reduced. The sidewall spacer between the gate electrode and the source/drain regions may allow for the low-voltage high-speed operation of the MOS transistor without an increase in the parasitic capacitance between the gate electrode and the source/drain regions.

According to the fabrication process for the MOS transistor of the present invention, an MOS transistor which achieves low-voltage high-speed operation can be fabricated while a remarkable increase in the number of process steps is suppressed in comparison with the conventional MOS transistor fabrication processes. During the fabrication process, the insulating film can be efficiently used as an etching stopper, and the semiconductor substrate is not subjected to etching, so that damages to the semiconductor substrate surface can be prevented. The photolithographic step for determining the gate length is performed in an early stage of the fabrication process sequence and, therefore, is not influenced by a level difference of the underlying pattern. Since there is no need to perform the photolithographic step for determining the gate length on a material having a high reflection factor, the fine pattern of the gate electrode can be readily formed. The gate length once determined by the photolithographic step may be adjusted more finely by the thickness of the insulating film to be subsequently formed. This allows for stabler and finer control of the gate length. Since the channel region can be substantially leveled with the source/drain regions, a level difference on the semiconductor substrate is equivalent to the height of the gate electrode which is very small. Thus, the photolithographic step can be readily performed in the interconnection step after the fabrication of the MOS transistor.

What is claimed is:

1. An MOS transistor comprising:

a semiconductor substrate having a field region;

a gate electrode formed on the semiconductor substrate through the intermediatry of a gate insulating film; and source/drain regions formed in the semiconductor substrate;

wherein the field region including at least a lower insulating film and an upper insulating film made of a material permitting the upper insulating film to be selectively etched with respect to the lower insulating film;

the gate electrode being configured such that the gate length of a top surface thereof is greater than the gate length of a bottom surface thereof facing a channel region positioned between the source/drain regions; the gate electrode having a sidewall spacer formed of a sidewall insulating layer made of the lower insulating film and a material permitting the sidewall insulating layer to be selectively etched with respect to the upper insulating film, the sidewall spacer contacting a side wall of the gate electrode for covering an outer periphery of the channel region; and the channel region being substantially leveled with the source/drain regions.

2. An MOS transistor as set forth in claim 1, wherein the upper insulating film is formed of a material which is able to be etched at a rate 5 to 30 times higher than a material for the lower insulating film.

3. An MOS transistor as set forth in claim 1, wherein the upper insulating film is formed of a silicon oxide film, and the lower insulating film is formed of a double-layer film comprised of a silicon nitride film/a silicon oxide film.

4. An MOS transistor as set forth in claim 1, wherein the sidewall insulating layer includes a silicon oxide film and a silicon nitride film covering the silicon oxide film.

5. An MOS transistor as set forth in claim 1, wherein the upper insulating film is formed of a silicon oxide film, the lower insulating film is formed of a double-layer film comprised of a silicon nitride film/a silicon oxide film, and the sidewall insulating layer includes a silicon oxide film and a silicon nitride film covering the silicon oxide.

6. A process for fabricating an MOS transistor, comprising the steps of:

(i) forming a lower insulating film and an upper insulating film on the entire surface of a semiconductor substrate, and forming an opening extending to the lower insulating film in the upper insulating film on a channel region and a periphery portion of the channel region;

(ii) forming a sidewall insulating layer of a material permitting the sidewall insulating layer to be selectively etched with respect to the upper insulating films on a side wall of the opening formed in the upper insulating film, and removing a portion of the lower insulating film which is present in the bottom of the opening and does not underlie the sidewall insulating layer to expose the semiconductor substrate;

(iii) forming a gate insulating film on the exposed semiconductor substrate;

(iv) forming a gate electrode on the gate insulating film so that at least a portion of the sidewall insulating layer is covered therewith; and (v) removing a portion of the upper insulating film which overlies regions where source/drain regions are to be formed, to form a sidewall spacer contacting a side wall of the gate electrode.

7. A process as set forth in claim 6, wherein the lower insulating film is formed of a first insulating film and a second insulating film made of a material permitting the second insulating film to be selectively etched with respect to the first insulating film, in the step (i).

8. A process as set forth in claim 6, wherein the lower insulating film is formed of a silicon nitride film/a silicon oxide film, and the upper insulating film is formed of a silicon oxide film, in the step (i).

9. A process as set forth in claim 6, wherein the sidewall insulating layer is formed of a silicon nitride film and a silicon oxide film in this order on the upper insulating film including the opening, in the step (ii).

10. A process as set forth in claim 6, further comprising the step of:

(vi) forming source/drain regions by first-ion-implanting at an angle of not less than $\theta_1$ (tan $\theta_1$=SG/Sh, where SG is a distance between an end of the sidewall spacer and an end of the gate electrode, Sh is the height of the sidewall spacer) and then second-ion-implanting at an angle of not less than $\theta_2$ (tan $\theta_2$=BS/Sh, where BS is a distance between an end of a bottom surface of the gate electrode facing the channel region and an end of a top surface of the gate electrode) with use of the gate electrode and the sidewall spacer as a mask.

* * * * *